United States Patent
Kubota et al.

(10) Patent No.: US 10,163,940 B2
(45) Date of Patent: Dec. 25, 2018

(54) DISPLAY DEVICE

(71) Applicant: Semiconductor Energy Laboratory Co., Ltd., Atsugi-shi, Kanagawa-ken (JP)

(72) Inventors: Daisuke Kubota, Atsugi (JP); Yuji Iwaki, Isehara (JP); Kensuke Yoshizumi, Isehara (JP); Mari Tateishi, Ebina (JP); Natsuko Takase, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/596,408

(22) Filed: May 16, 2017

(65) Prior Publication Data
US 2017/0338246 A1 Nov. 23, 2017

(30) Foreign Application Priority Data
May 20, 2016 (JP) .................... 2016-101134

(51) Int. Cl.
| | |
|---|---|
| H01L 29/04 | (2006.01) |
| H01L 31/036 | (2006.01) |
| H01L 27/12 | (2006.01) |
| G02F 1/1335 | (2006.01) |
| G02F 1/1362 | (2006.01) |
| G02F 1/1333 | (2006.01) |
| G02F 1/1345 | (2006.01) |
| H01L 27/32 | (2006.01) |

(52) U.S. Cl.
CPC ........ *H01L 27/124* (2013.01); *G02F 1/13458* (2013.01); *G02F 1/133305* (2013.01); *G02F 1/133528* (2013.01); *G02F 1/136286* (2013.01); *H01L 27/1225* (2013.01); *G02F 2001/136222* (2013.01); *H01L 27/3276* (2013.01)

(58) Field of Classification Search
CPC .............. H01L 27/124; H01L 27/3244; H01L 27/3276; H01L 27/1222
USPC .......................................... 257/72
See application file for complete search history.

(56) References Cited

U.S. PATENT DOCUMENTS

| | | | |
|---|---|---|---|
| 7,485,511 B2 | 2/2009 | Yamada et al. | |
| 8,956,891 B2 | 2/2015 | Chida | |
| 9,761,654 B2 | 9/2017 | Tsuruoka et al. | |

(Continued)

FOREIGN PATENT DOCUMENTS

JP 2015-072361 A 4/2015

*Primary Examiner* — Theresa T Doan
(74) *Attorney, Agent, or Firm* — Robinson Intellectual Property Law Office; Eric J. Robinson

(57) ABSTRACT

A highly reliable display device is provided. The display device includes a first substrate, a first resin layer over the first substrate, a pixel portion and a terminal portion over the first resin layer, a second resin layer over the terminal portion, and a second substrate over the second resin layer. The pixel portion includes a transistor and a display element electrically connected to the transistor. The terminal portion includes a conductive layer. The first resin layer includes an opening. The conductive layer includes a first region that is exposed in the opening in the first resin layer. The second resin layer includes a region overlapping with the first region. The conductive layer is the same layer as at least one of a gate of the transistor and a source and a drain of the transistor.

13 Claims, 11 Drawing Sheets

(56) References Cited

U.S. PATENT DOCUMENTS

| | | | |
|---|---|---|---|
| 2014/0273317 A1* | 9/2014 | Chida | H01L 33/62 438/26 |
| 2017/0176791 A1 | 6/2017 | Kubota et al. | |
| 2017/0278878 A1 | 9/2017 | Kuwabara et al. | |
| 2017/0294463 A1* | 10/2017 | Yamazaki | H01L 27/1266 |

* cited by examiner

DISPLAY DEVICE

BACKGROUND OF THE INVENTION

1. Field of the Invention

One embodiment of the present invention relates to a display device and a manufacturing method thereof.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

Note that in this specification and the like, a semiconductor device refers to every device that can function by utilizing semiconductor characteristics. A transistor, a semiconductor circuit, an arithmetic device, a memory device, and the like are each one embodiment of the semiconductor device. In some cases, the semiconductor device is included in an imaging device, an electro-optical device, a power generation device (e.g., a thin film solar cell and an organic thin film solar cell), and an electronic device.

2. Description of the Related Art

In recent years, display devices using display elements such as organic electroluminescent (EL) elements or liquid crystal elements have been actively developed. Flexible display devices, in which semiconductor elements such as transistors and display elements such as organic EL elements are provided over a substrate (film) having flexibility, have also been developed. These display devices are mainly active matrix display devices that include transistors arranged in a matrix in pixel portions.

In such a display device, a terminal portion is provided over a substrate and a flexible printed circuit (FPC) is mounted on the terminal portion so that power and input signals are supplied to a driver circuit for driving transistors in a pixel portion.

Patent Document 1 discloses a display device in which a thin film transistor and a display element are arranged on one surface of a flexible circuit, an FPC is arranged on the other surface, and the thin film transistor is connected to the FPC through a conductor in a through-hole formed in the flexible substrate.

REFERENCE

Patent Document

[Patent Document 1] Japanese Published Patent Application No. 2015-72361

SUMMARY OF THE INVENTION

When an FPC is mounted, a connector such as the FPC and an electrode of a terminal portion provided on a substrate are bonded together through an anisotropic conductive film and brought into conduction by thermocompression bonding. An element such as a transistor or a display element, or a wiring on the substrate might be damaged by pressure applied in this thermocompression bonding step, leading to display failure of the display device. Particularly in the case where a flexible substrate is used as the substrate, the substrate might be deformed due to its flexibility, which might cause cracks in the element or the wiring.

In view of the above, an object of one embodiment of the present invention is to provide a highly reliable display device.

In addition, the frame width or the cost of the display device need to be further reduced. Thus, an object of one embodiment of the present invention is to provide a display device with a narrow frame. Another object of one embodiment of the present invention is to provide a low-cost display device.

Note that the description of these objects does not preclude the existence of other objects. One embodiment of the present invention does not necessarily achieve all the objects. Other objects can be derived from the description of the specification and the like.

One embodiment of the present invention is a display device including a first substrate, a first resin layer over the first substrate, a pixel portion and a terminal portion over the first resin layer, a second resin layer over the terminal portion, and a second substrate over the second resin layer. The pixel portion includes a transistor and a display element electrically connected to the transistor. The terminal portion includes a conductive layer. The first resin layer includes an opening. The conductive layer includes a first region that is exposed in the opening in the first resin layer. The second resin layer includes a region overlapping with the first region. The conductive layer is the same layer as at least one of a gate of the transistor and a source and a drain of the transistor.

Another embodiment of the present invention is a display device including a first substrate, a first resin layer over the first substrate, a pixel portion and a terminal portion over the first resin layer, a second resin layer over the terminal portion, a third resin layer over the pixel portion and the terminal portion, and a second substrate over the third resin layer. The pixel portion includes a transistor and a display element electrically connected to the transistor. The terminal portion includes a conductive layer. The first resin layer includes an opening. The conductive layer includes a first region that is exposed in the opening in the first resin layer. The second resin layer includes a region overlapping with the first region. The conductive layer is the same layer as at least one of a gate of the transistor and a source and a drain of the transistor.

In the above display device, the conductive layer may have a stacked structure of a first conductive layer and a second conductive layer, and the first conductive layer may include an oxide conductive material and have a region in contact with the first resin layer.

In the above display device, an FPC electrically connected to the terminal portion may be provided and the FPC may have a region overlapping with the pixel portion. In that case, a third substrate including an IC chip may be provided between the first substrate and the FPC, and the FPC may be electrically connected to the terminal portion through the IC chip.

In the above display device, the second resin layer may function as a sealant.

In the above display device, the second resin layer may function as a spacer.

Another embodiment of the present invention is a display device including a first substrate, a terminal portion and a pixel portion above the first substrate, a resin layer above the terminal portion, a second substrate above the terminal portion and the pixel portion, and an FPC. The pixel portion includes a transistor and a display element electrically connected to the transistor. The terminal portion includes a conductive layer that is the same layer as at least one of a gate of the transistor and a source and a drain of the transistor. The FPC is electrically connected to the conductive layer. The FPC includes a region overlapping with the pixel portion, and a region overlapping with the resin layer with the conductive layer therebetween.

According to one embodiment of the present invention, a highly reliable display device can be provided. According to another embodiment of the present invention, a display device with a narrow frame can be provided. According to another embodiment of the present invention, a low-cost display device can be provided.

DETAILED DESCRIPTION OF THE INVENTION

Figure 1A:
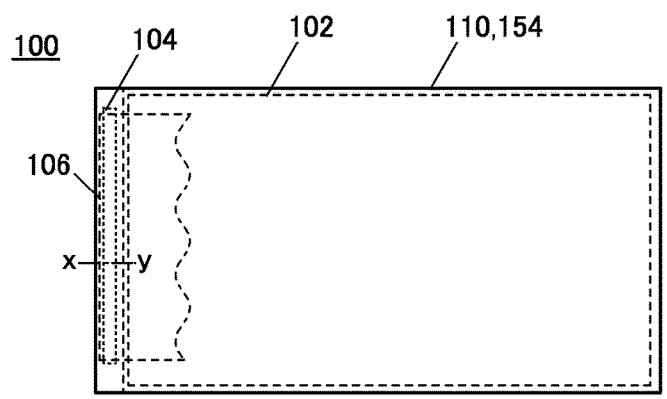
FIGS. 1A and 1B are a plan view and a cross-sectional view illustrating a structure example of a display device.

Embodiments of the present invention will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and the description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases, and therefore, it is not limited to the illustrated scale.

Note that in this specification and the like, ordinal numbers such as "first" and "second" are used to avoid confusion among components and do not limit the number.

A transistor is a kind of semiconductor elements and can achieve amplification of current and voltage, switching operation for controlling conduction and non-conduction, and the like. A transistor in this specification includes an insulated-gate field effect transistor (IGFET) and a thin film transistor (TFT).

In this specification and the like, a display device includes in its category a panel in which a display element is sealed, and a module in which an IC including a controller or the like is mounted on the panel. In other words, the display device in this specification means an image display device or a light source (including a lighting device). Furthermore, the display device also includes the following modules in its category: a module in which a display element is attached to a connector such as an FPC or a tape carrier package (TCP); a module having a TCP at the tip of which a printed wiring board is provided; and a module in which an integrated circuit (IC) is directly mounted on a display element by a COG method.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic EL element and an organic EL element. Furthermore, a display medium whose contrast is changed by an electric effect, such as an electronic ink display device (electronic paper), can be used.

When thin films included in the display device are processed, a lithography method or the like can be used for the processing. Alternatively, island-shaped thin films may be formed by a film formation method using a blocking mask. A nanoimprinting method, a sandblasting method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV light, X-rays, or an electron beam because extremely minute processing can be performed. Note that in the case where exposure is performed by scanning of a beam such as an electron beam, a photomask is not needed.

Embodiment 1

In this embodiment, a display device of one embodiment of the present invention and a manufacturing method thereof will be described with reference to FIG. 1A to FIG. 6B.

<Structure Example 1 of Display Device>

Figure 1B:
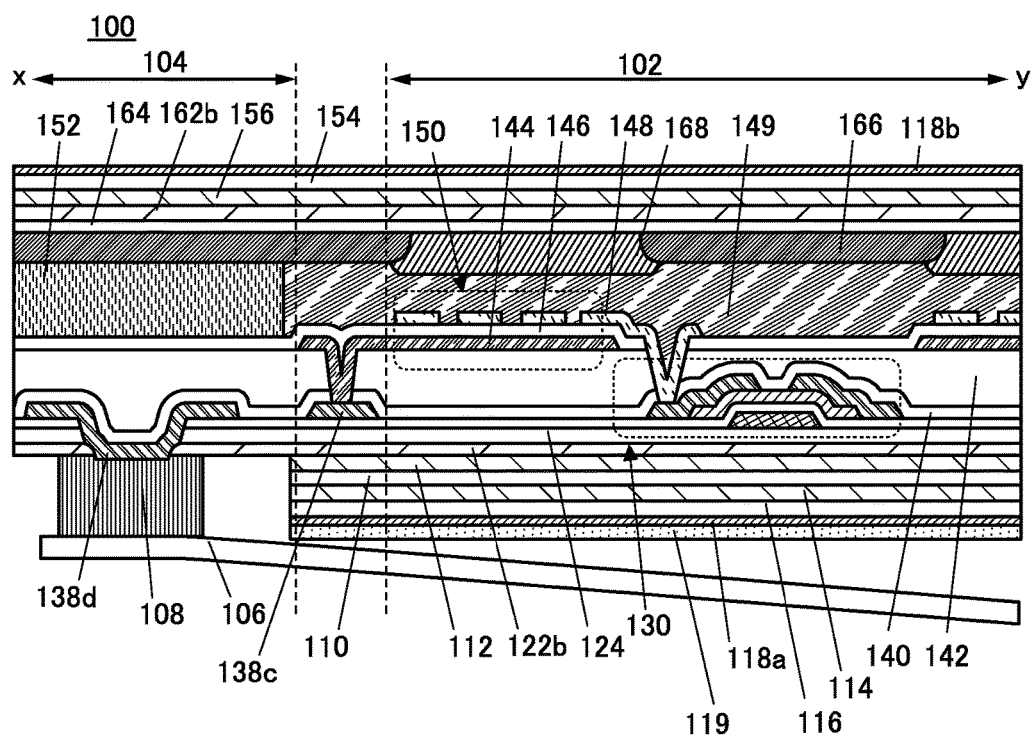

FIGS. 1A and 1B illustrate a structure example of a display device 100. FIG. 1A is a plan view of the display device 100. FIG. 1B is a cross-sectional view along dashed-dotted line x-y in FIG. 1A.

The display device 100 illustrated in FIG. 1A includes a pixel portion 102, which is sealed between a first substrate 110 and a second substrate 154, a terminal portion 104, and an FPC 106 electrically connected to the terminal portion 104. The FPC 106 has a function of supplying various signals and potentials to transistors in the pixel portion 102 through a gate driver circuit or a source driver circuit. Each of the gate driver circuit and the source driver circuit may be constituted by transistors that are provided over the same substrate as the transistors in the pixel portion. Alternatively or additionally, an IC chip may be mounted on the FPC 106 by a chip on film (COF) method or the like. For example, a scan line driver circuit can be constituted by transistors that are provided over the same substrate as the transistors in the pixel portion, and an IC chip including a signal line driver circuit can be mounted by the COF method.

In the case where the display device 100 includes a sensor such as a touch sensor, the display device 100 may further include a sensor driver circuit. The sensor driver circuit may be constituted by transistors that are provided over the same substrate as the transistors in the pixel portion, or an IC chip may be mounted on the FPC 106 by the COF method.

Note that FIGS. 1A and 1B illustrate the display device 100 that includes one FPC 106; however, one embodiment of the present invention is not limited to this structure example. For example, a plurality of FPCs may be provided, and in that case, a plurality of sides may be connected to the FPCs.

FIG. 1B is a schematic cross-sectional view along dashed-dotted line x-y in FIG. 1A, which crosses a region including the terminal portion 104 and the FPC 106 and a region including the pixel portion 102.

In FIG. 1B, the display device 100 includes the pixel portion 102 and the terminal portion 104 above the first substrate 110. The second substrate 154 is provided over the first substrate 110 with the pixel portion 102 positioned therebetween. The first substrate 110 is bonded to a resin layer 122b with an adhesive layer 112. The second substrate 154 is bonded to a resin layer 162b with an adhesive layer 156. In addition, a resin layer 152 functioning as a sealant is provided in a closed loop manner to surround the periphery of the pixel portion 102; thus, the pixel portion 102 is sealed by the resin layer 152, the first substrate 110, and the second substrate 154.

A conductive layer 138d positioned in the terminal portion 104 has a function of being electrically connected to the FPC 106 through a connector 108. The conductive layer 138d includes an exposed region in an opening provided in the resin layer 122b, and is in contact with the connector 108 in the exposed region. In addition, the first substrate 110 is positioned so as not to overlap at least with the exposed region of the conductive layer 138d in the opening provided in the resin layer 122b.

The conductive layer 138d is preferably formed with a conductive layer that is used for at least one of a gate, and a source and a drain of a transistor 130 positioned in the pixel portion 102. Such a structure can simplify the manufacturing process of the conductive layer 138d, which functions as an electrode of the terminal portion 104, and can reduce the manufacturing costs of the display device.

In the display device 100 of one embodiment of the present invention, a region where the conductive layer 138d in the terminal portion 104 is electrically connected to the FPC 106 (i.e., a region where the conductive layer 138d is in contact with the connector 108), is positioned so as to overlap with the resin layer 152. The resin layer 152 functions as a sealant and contains a material having elasticity, such as a thermosetting resin. When the resin layer 152 containing such a material is positioned so as to overlap with the region where the conductive layer 138d in the terminal portion 104 is connected to the FPC 106, the resin layer 152 can function as a buffer against pressure applied in a thermocompression bonding step of the FPC 106. Accordingly, an element, a wiring, and the like can be prevented from being damaged by the pressure applied in the thermocompression bonding of the FPC 106, so that the reliability of the display device 100 can be increased.

Furthermore, the FPC 106 can be positioned on a side opposite to the display surface when the conductive layer 138d is electrically connected to the FPC 106 through the opening in the resin layer 122b. Here, the conductive layer 138d functions as a through-electrode or a rear electrode. When the FPC 106 is positioned on the side opposite to the display surface, the display device 100 can be incorporated into an electronic device without needing a space where the FPC 106 is folded, achieving a smaller-size electronic device.

In addition, when the region where the conductive layer 138d is connected to the FPC 106 is positioned so as to overlap with the resin layer 152, the pixel portion 102 can be formed in a large region as compared with the case where the connection region is positioned in the closed-loop of the resin layer 152. This allows reducing the frame width of the display device 100.

The pixel portion 102 includes the transistor 130, which is provided over the resin layer 122b with an insulating layer 124 therebetween, and a display element electrically connected to the transistor 130. This embodiment shows an example of a liquid crystal display device that uses a liquid crystal element 150 as the display element. Note that there is no particular limitation on the display element that can be used in the display device of this embodiment, and any display element can be used as long as display can be performed.

In the example of FIG. 1B, a bottom-gate transistor is provided as the transistor 130 in the pixel portion 102; however, one embodiment of the present invention is not limited to this example.

The transistor 130 is a channel-etched transistor and can be suitably used for a high-definition display device, because the area occupied by the transistor can be reduced comparatively easily.

There is no particular limitation on a semiconductor material used for the transistor, and for example, silicon, germanium, or an oxide semiconductor can be used.

There is no particular limitation on the crystallinity of a semiconductor used for the transistor, and an amorphous semiconductor or a semiconductor having crystallinity (a microcrystalline semiconductor, a polycrystalline semiconductor, a single crystal semiconductor, or a semiconductor partly including crystal regions) may be used.

In the case where a liquid crystal element is used as the display element, a vertical electric field type or a horizontal electric field type can be applied to the liquid crystal display device. FIG. 1B shows an example of employing a fringe field switching (FFS) mode as an example of the horizontal electric field mode.

One pixel includes at least one switching transistor 130. In addition, a storage capacitor not illustrated may be provided. An insulating layer 140 and an insulating layer 142 that cover the transistor 130 are formed between the transistor 130 and the liquid crystal element 150. Note that there is no particular limitation on the number of insulating layers that cover the transistor 130. In this embodiment, the insulating layers 140 and 142 are provided on the entire surface of the display device 100. Such a structure is preferable because the yield of the manufacturing process of the display device can be increased. Alternatively, the insulating layer 142 or the insulating layers 140 and 142 may be removed at an end portion of the display device. When the insulating layer is removed at the end portion of the display device, entry of impurities from an end surface of the insulating layer, which is exposed at the end portion, can be prevented. Such a structure is particularly effective in the case where an organic material is used for the insulating layer 142.

The liquid crystal element 150 includes a first electrode 148, which has a comb-like shape and is electrically connected to the source or the drain of the transistor 130, a second electrode 144, which overlaps with the first electrode 148 with an insulating layer 146 therebetween, and a liquid crystal 149. The first electrode 148 functions as a pixel electrode whereas the second electrode 144 functions as a common electrode. Note that the second electrode 144 is electrically connected to a conductive layer 138c, which is the same layer as the conductive layer 138d, on the periphery of the pixel portion 102.

A conductive material having a light-transmitting property is used for the second electrode 144, or the first electrode 148 and the second electrode 144. Both of these electrodes are preferably formed using the light-transmitting conductive material because the aperture ratio of a pixel can be increased. As the light-transmitting conductive material, a conductive oxide such as indium oxide, indium tin oxide, indium zinc oxide, zinc oxide, or zinc oxide to which gallium is added, or graphene can be used.

In this embodiment, the insulating layer 146 positioned between the first electrode 148 and the second electrode 144 extends to the end portion of the display device 100 and includes a region in contact with the resin layer 152; however, one embodiment of the present invention is not limited to this example. For example, in the case where a driver circuit is constituted by transistors that are provided over the first substrate 110, the insulating layer 146 is preferably removed in an area where the driver circuit is formed.

Furthermore, a substrate 116 provided with a backlight 119 and a polarizer 118a is bonded to the outer surface of the first substrate 110 with an adhesive layer 114 so as to overlap at least with the pixel portion 102.

An image can be displayed with the liquid crystal element 150 in the following manner: a voltage is applied between the first electrode 148 and the second electrode 144 to generate an electric field in an oblique direction, the orientation of the liquid crystal 149 is controlled by the electric field, and the polarization of light from the backlight 119 provided below the pixel portion 102 is controlled in each pixel.

The backlight 119 is preferably positioned between the first substrate 110 and the FPC 106. Since the display device 100 includes a region where the pixel portion 102 and the FPC 106 overlap, when the backlight 119 is provided in the above position, light from the backlight 119 can be emitted to the pixel portion 102 without being affected by the transmitting property of the FPC 106. Instead of the backlight 119, a light source such as a sidelight may be provided on a side surface of the pixel portion 102, and light from the light source may be transferred to the pixel portion 102 with a light-guiding plate.

An alignment film that controls the alignment of the liquid crystal 149 may be provided on a surface in contact with the liquid crystal 149. A light-transmitting material is used for the alignment film.

A color filter 168 and a black matrix 166 are provided on the second substrate 154 side at least in a region that overlaps with the pixel portion 102. The color filter 168 and the black matrix 166 are arranged so as to overlap with the resin layer 162b with an insulating layer 164 therebetween. A polarizer 118b is provided on the outer surface of the second substrate 154.

In the display device 100, the color filter is provided in a region that overlaps with the liquid crystal element 150; thus, a full-color image can be displayed using a backlight that emits white light. When a plurality of light-emitting diodes (LEDs) that emit light of different colors are used as the backlight 119, a time-division display method (a field-sequential driving method) can be employed. In the case of employing the time-division display method, the aperture ratio of each pixel or the number of pixels per unit area can be increased because neither the color filter 168 nor subpixels that emit light of, for example, red (R), green (G), and blue (B), are needed.

The color filter 168 is provided in order to adjust the color of light emitted from a light source to increase the color purity. For example, in a full-color display device using a white backlight, a plurality of pixels provided with color filters of different colors are used. In that case, the color filters may be those of three colors of red (R), green (G), and blue (B) or four colors (yellow (Y) in addition to these three colors). Furthermore, a white (W) pixel may be added to R, G, and B pixels (and a Y pixel).

The black matrix 166 is provided between the adjacent color filters 168. The black matrix 166 blocks light emitted from an adjacent pixel, thereby preventing color mixture between the adjacent pixels. The black matrix 166 may be provided only between adjacent pixels of different emission colors and not between pixels of the same emission color. Here, the color filter 168 is provided so that its end portions overlap with the black matrix 166, whereby light leakage can be reduced. The black matrix 166 can be formed using a material that blocks light, for example, a metal material or a resin material including a pigment. Note that the black matrix 166 is preferably provided also in a region other than the pixel portion 102, such as in the terminal portion 104 as illustrated in FIG. 1B, in which case undesired leakage of guided light or the like can be prevented.

Although not illustrated, an overcoat may be provided to cover the color filter 168 and the black matrix 166. With the overcoat, an impurity and the like contained in the color filter 168 can be prevented from diffusing into the display element. The overcoat is made of a light-transmitting material, e.g., an inorganic insulating film such as a silicon nitride film or a silicon oxide film or an organic insulating film such as an acrylic film or a polyimide film can be used, or the organic insulating film and the inorganic insulating film may be stacked.

<Method for Manufacturing Display Device>

An example of the method for manufacturing the display device 100 illustrated in FIGS. 1A and 1B will be described with reference to FIG. 2A to FIG. 6B.

Figure 2A:
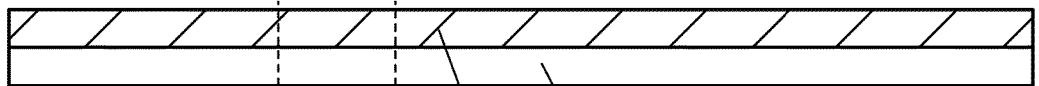
FIGS. 2A to 2F illustrate a method for manufacturing the display device.

First, as a precursor layer for forming a resin layer, a precursor layer 121 is formed over a support substrate 120 (FIG. 2A).

As the support substrate 120, a substrate that has stiffness high enough to facilitate the transfer and has resistance to heat applied in the manufacturing process is used. For example, a material such as glass, quartz, ceramics, sapphire, an organic resin, a semiconductor, a metal, or an alloy can be used for the support substrate 120. As the glass, for example, alkali-free glass, barium borosilicate glass, or aluminoborosilicate glass can be used.

The precursor layer 121 is formed by depositing a photosensitive resin material. When the photosensitive resin material is used for the precursor layer 121, the precursor layer 121 can be partly removed by a photolithography method to be processed into a desired shape. Further preferably, a photosensitive thermosetting material is used for the precursor layer 121. With such a material, the resin layer having a desired shape can be formed in a simple process.

A photosensitive polyimide resin can be typically used as the material for the precursor layer 121. The photosensitive polyimide resin is a material suitable for a planarization film or the like of a display panel; hence, a common deposition apparatus and a common material can be shared. That is, the display device of one embodiment of the present invention can be manufactured with existing apparatuses, and therefore, can be manufactured without requiring a new apparatus nor increasing the production costs.

As the material for the precursor layer 121, for example, a photosensitive resin material such as an acrylic resin, an epoxy resin, a polyamide resin, a polyimide amide resin, a siloxane resin, a benzocyclobutene-based resin, or a phenol resin may be used. Note that these resin materials are included in the resin layer that is formed through light exposure and development steps of the precursor layer 121.

The precursor layer 121 is preferably formed by a coating method, e.g., spin coating, dipping, spray coating, inkjetting, dispensing, screen printing, or offset printing, or with a doctor knife, a slit coater, a roll coater, a curtain coater, or a knife coater. In particular, the precursor layer 121 is preferably formed by spin coating using a spin coater, in which case a thin-film precursor can be uniformly deposited on a large substrate.

The precursor layer 121 preferably has a thickness of greater than or equal to 0.01 µm and less than 10 µm, further preferably greater than or equal to 0.1 µm and less than or equal to 3 µm, and still further preferably greater than or equal to 0.5 µm and less than or equal to 1 µm. With a solution having low viscosity, the precursor layer 121 having a small thickness can be easily formed, resulting in lower manufacturing costs of the display device.

After the formation of the precursor layer 121, heat treatment (pre-baking treatment) for removing a solvent is performed, which is followed by light exposure using a photomask. Then, development and heat treatment (post-baking treatment) are performed, whereby a resin layer 122 processed into a desired shape is obtained.

Figure 2B:
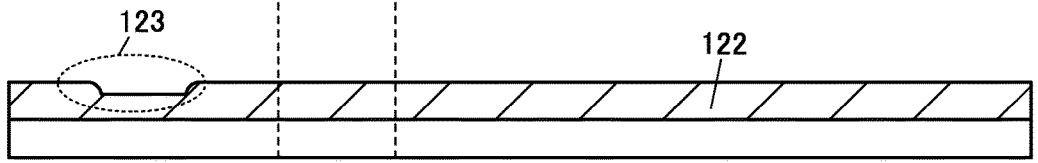

In this embodiment, the resin layer 122 is formed using a multi-tone mask (e.g., a gray tone mask or a halftone mask) as the photomask, so that a region 123 with a smaller thickness is included in the resin layer 122 as illustrated in FIG. 2B. Note that the region 123 preferably has a tapered end portion in order to increase the coverage with an insulating layer or a conductive layer that is formed over the resin layer 122 so as to cover the region 123.

Note that the heat treatment (post-baking treatment) after the development treatment can reduce released gas components (e.g., hydrogen or water) in the resin layer 122. The heat treatment here is preferably performed at a temperature higher than the maximum temperature in the fabrication steps of a transistor that is formed over the resin layer 122 in a subsequent process. For example, in the case where the maximum temperature in the fabrication steps of the transistor is 350° C., the precursor layer 121 is preferably subjected to the post-baking treatment at a temperature higher than 350° C. and lower than or equal to 450° C., further preferably higher than 350° C. and lower than or equal to 400° C., still further preferably higher than 350° C. and lower than 400° C., and yet still further preferably higher than 350° C. and lower than 375° C. When the precursor layer 121 (or the resin layer 122) is heated at a temperature within the above range, a gas released from the resin layer 122 in the fabrication steps of the transistor can be reduced.

Then, the insulating layer 124 is formed over the resin layer 122. The insulating layer 124 is formed at a temperature at least lower than or equal to the upper temperature limit of the resin layer 122, and preferably formed at a temperature lower than the temperature in the post-baking treatment.

The insulating layer 124 can be used as a barrier layer that prevents diffusion of impurities contained in the support substrate 120 and the resin layer 122 into the transistor and a display element that are formed later; thus, a material with a high barrier property is preferably used. The insulating layer 124 can also function as a barrier layer that reduces damage on the resin layer 122 in the fabrication steps of the transistor formed later.

As the insulating layer 124, specifically, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used. In particular, a silicon nitride film and a silicon oxide film are preferably stacked in this order from the support substrate 120 side.

In the case where an inorganic insulating film is used for the insulating layer 124, the substrate temperature during the deposition is preferably higher than or equal to room temperature (e.g., 25° C.) and lower than or equal to 350° C., and further preferably higher than or equal to 100° C. and lower than or equal to 300° C. Higher deposition temperatures are preferable because the insulating film can have a higher density and a higher barrier property.

Alternatively, a stack of an organic insulating material and an inorganic insulating material may be used for the insulating layer 124. The organic insulating material can be an organic resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin. The organic insulating material preferably has a higher heat resistance than the material for the resin layer 122.

In the case where an organic insulating film is used for the insulating layer 124, the temperature during the deposition is preferably higher than or equal to room temperature and lower than or equal to 350° C., and further preferably higher than or equal to room temperature and lower than or equal to 300° C.

Then, a conductive layer 132 is formed over the insulating layer 124. Part of the conductive layer 132 functions as the gate of the transistor. The conductive layer 132 is preferably formed at a temperature higher than or equal to room temperature and lower than or equal to 350° C., and further preferably higher than or equal to room temperature and lower than or equal to 300° C.

The conductive layers included in the display device can each have a single-layer structure or a stacked-layer structure that includes any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide, indium oxide containing tungsten, indium zinc oxide containing tungsten, indium oxide containing titanium, indium tin oxide containing titanium, indium zinc oxide, zinc oxide (ZnO), ZnO to which gallium is added, or indium tin oxide containing silicon may be used. Alternatively, a semiconductor such as polycrystalline silicon or an oxide semiconductor whose resistance is lowered, for example, by adding an impurity element, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Figure 2C:
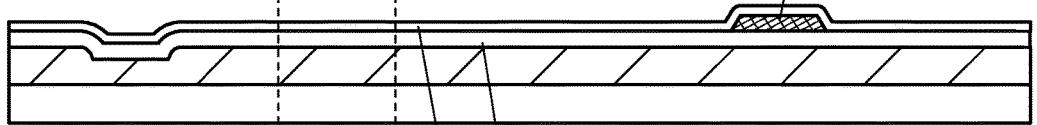

Then, an insulating layer 134, part of which functions as a gate insulating layer, is formed (FIG. 2C). The insulating layer 134 can be formed using an inorganic insulating film that can be used for the insulating layer 124.

Next, the insulating layers 124 and 134 that are in a region overlapping with the region 123 of the resin layer 122 are removed so that openings reaching the region 123 are formed in the insulating layers 124 and 134. The openings in the insulating layers 124 and 134 may be formed in different steps or the same step. This embodiment shows, but is not limited to, an example in which the openings in the insulating layers 124 and 134 are formed before the formation of a semiconductor layer. The openings in the insulating layers 124 and 134 may be formed at any time after the formation of the insulating layers 124 and 134 and before the later formation of the conductive layer 138*d*.

Then, a semiconductor layer is formed over the insulating layer 134. There is no particular limitation on the semiconductor material used for the display device of one embodiment of the present invention; an oxide semiconductor is preferably used. As mentioned above, the post-baking for forming the resin layer 122 is preferably performed at a temperature higher than the formation temperature of each layer that is formed over the resin layer 122. That is, in consideration of the heat resistance of the resin layer 122, a lower maximum temperature in the fabrication steps of the transistor offers a wider choice of materials for the resin layer 122. Unlike low-temperature polysilicon, the oxide semiconductor does not require a dehydrogenation step at high temperatures (e.g., approximately 500° C.). Hence, the use of the oxide semiconductor as the semiconductor material allows a low heat-resistant (e.g., approximately 350° C.) and low-cost material to be selected as a resin material for the resin layer 122. Note that the heat resistance of the resin layer can be evaluated by, for example, weight loss percentage due to heating, specifically 5% weight loss temperature. The 5% weight loss temperature of the resin layer can be lower than or equal to 450° C., preferably lower than or equal to 400° C., further preferably lower than 400° C., and still further preferably lower than 350° C. In addition, the maximum temperature in the fabrication steps of components such as the transistor 130 over the resin layer 122 is preferably lower than or equal to 350° C.

Note that the oxide semiconductor does not require a laser process for crystallization, i.e., the thickness of the resin layer 122 does not need to increase so as to prevent damage due to laser treatment for crystallization. Also in this respect, the display device can be manufactured at low cost. Furthermore, the oxide semiconductor typically has a band gap greater than or equal to 2.5 eV, which is wider than that of silicon (1.1 eV). Such a material with a wide band gap and a low carrier density is preferably used for a channel of a transistor because the off-state current of the transistor can be reduced.

Figure 2D:
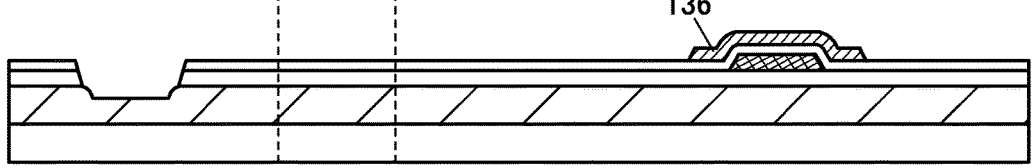

In this embodiment, for example, an oxide semiconductor layer 136 containing In, Ga, and Zn is formed as the semiconductor layer by a sputtering method (FIG. 2D).

There is no particular limitation on the crystallinity of the oxide semiconductor layer 136. The oxide semiconductor layer 136 can have a single-layer structure or a stacked-layer structure. In the case where the oxide semiconductor layer 136 has a stacked-layer structure, layers that include the same oxide semiconductor material and have different compositions may be stacked or layers that include different oxide semiconductor materials may be stacked. The crystallinity of each layer in the stacked oxide semiconductor layers may be the same or different.

The substrate temperature during the formation of the oxide semiconductor film is preferably lower than or equal to 350° C., further preferably higher than or equal to room temperature and lower than or equal to 200° C., and still further preferably higher than or equal to room temperature and lower than or equal to 130° C. Note that an increase in the substrate temperature during deposition results in a larger number of crystal parts with orientation.

The oxide semiconductor film can be formed using one or both of an inert gas (typically Ar gas) and an oxygen gas. In the case where an oxygen gas is used for forming the oxide semiconductor film, the percentage of oxygen flow rate (partial pressure of oxygen) during deposition is preferably higher than 0% and lower than 33%, further preferably higher than or equal to 5% and lower than or equal to 30%, further preferably higher than or equal to 5% and lower than or equal to 20%, still further preferably higher than or equal to 5% and lower than or equal to 15%, and typically 10%. The oxygen gas is not necessarily used for forming the oxide semiconductor film. A decrease in oxygen flow rate results in a larger number of crystal parts with no orientation in the film.

An oxide target that can be used for forming the oxide semiconductor film can be, for example, an In—M-Zn-based oxide (M is Ga, Al, Y, or Sn). In particular, an In—Ga—Zn-based oxide is preferably used.

Note that the above description is made on, but is not limited to, the case of using a sputtering method. For example, a pulsed laser deposition (PLD) method, a plasma-enhanced chemical vapor deposition (PECVD) method, a thermal chemical vapor deposition (CVD) method, an atomic layer deposition (ALD) method, or a vacuum evaporation method may be used. An example of the thermal CVD method is a metal organic chemical vapor deposition (MOCVD) method.

Figure 2E:
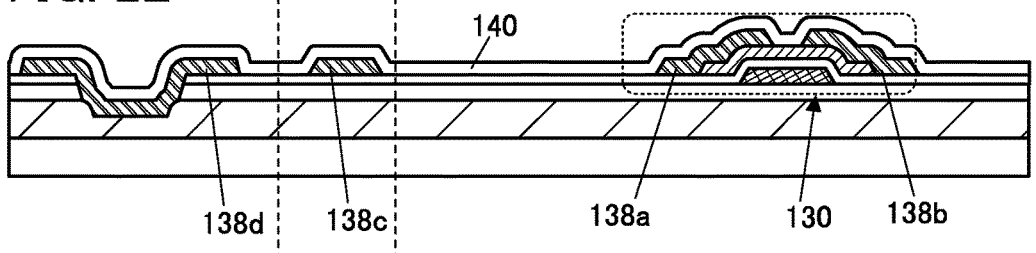

Then, conductive layers 138*a*, 138*b*, 138*c*, and 138*d* are formed (FIG. 2E). The conductive layers 138*a*, 138*b*, 138*c*, and 138*d* are formed by forming a conductive film, forming a resist mask, etching the conductive film, and then removing the resist mask. The conductive layers 138*a* and 138*b* are connected to the oxide semiconductor layer 136 and function as the source and the drain of the transistor. The conductive layer 138*c* is positioned on the periphery of the pixel portion 102 and electrically connected to a second electrode of a liquid crystal element that is formed later. The conductive layer 138d is in contact with the region 123 of the resin layer 122 through the openings in the insulating layers 124 and 134. The conductive layer 138d functions as the electrode of the terminal portion 104.

Note that this embodiment shows, but is not limited to, an example in which the conductive layer 138d functioning as the electrode of the terminal portion 104 is formed with the same conductive layer as the conductive layers 138a and 138b functioning as the source and the drain of the transistor. The conductive layer functioning as the electrode of the terminal portion 104 may be formed with the same conductive layer as the conductive layer 132 functioning as the gate of the transistor, or may have a stacked-layer structure including the same conductive layer as the conductive layer 132 and the same conductive layer as the conductive layers 138a and 138b. The same applies to the conductive layer 138c.

Note that during the processing of the conductive layers 138a and 138b, the oxide semiconductor layer 136 might be partly etched to be thin in a region not covered by the resist mask. This unintended etching can be prevented when an oxide semiconductor layer containing crystal parts with orientation is used for the oxide semiconductor layer 136.

Through the above steps, the transistor 130 is obtained. Note that in the transistor 130 shown as an example, the width of the oxide semiconductor layer 136 is wider than that of the conductive layer 132. In such a structure, the oxide semiconductor layer 136 is positioned between the conductive layer 132 and the conductive layer 138a or 138b. This can reduce the parasitic capacitance between the conductive layer 132 and the conductive layer 138a or 138b.

After the transistor 130 is formed, the insulating layer 140 covering the transistor 130 is formed (FIG. 2E). The insulating layer 140 can be formed in a manner similar to that of the insulating layer 124 or 134.

Note that the insulating layer 140 is preferably formed using an oxide insulating film (e.g., a silicon oxide film or a silicon oxynitride film) that is formed at the aforementioned low temperatures (350° C. or lower) under an atmosphere containing oxygen. An insulating film with low oxygen diffusibility and low oxygen permeability, such as a silicon nitride film, is preferably stacked over the silicon oxide film or the silicon oxynitride film. The oxide insulating film formed at low temperatures under an atmosphere containing oxygen can easily release a large amount of oxygen by heating. When such an oxide insulating film that releases oxygen and an insulating film with low oxygen diffusibility and low oxygen permeability are stacked and heated, oxygen can be supplied to the oxide semiconductor layer 136. As a result, oxygen vacancies in the oxide semiconductor layer 136 can be filled and defects at the interface between the oxide semiconductor layer 136 and the insulating layer 140 can be repaired, leading to a reduction in defect levels. Accordingly, an extremely highly reliable semiconductor device can be fabricated.

Figure 2F:
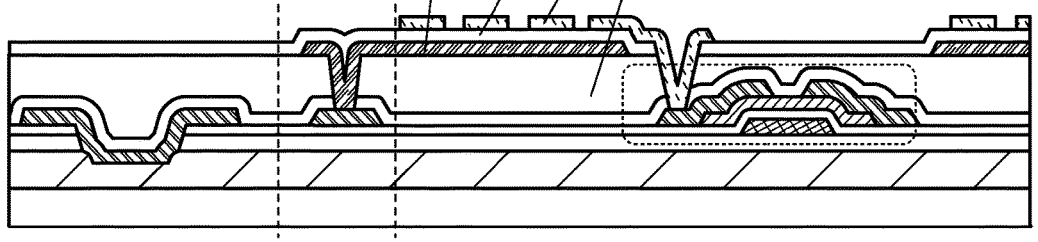

Then, the insulating layer 142 is formed over the insulating layer 140 (FIG. 2F). The display element is formed on the insulating layer 142 in a later step; thus, the insulating layer 142 preferably functions as a planarization layer. For the insulating layer 142, the description of the organic insulating film or the inorganic insulating film that can be used for the insulating layer 124 can be referred to.

The insulating layer 142 is formed at a temperature lower than or equal to the upper temperature limit of the resin layer 122, and preferably formed at a temperature lower than the temperature in the post-baking treatment. For example, in the case where an organic insulating film is used for the insulating layer 142, the temperature during the deposition is preferably higher than or equal to room temperature and lower than or equal to 350° C., and further preferably higher than or equal to room temperature and lower than or equal to 300° C. In the case where an inorganic insulating film is used for the insulating layer 142, the temperature during the deposition is preferably higher than or equal to room temperature and lower than or equal to 350° C., and further preferably higher than or equal to 100° C. and lower than or equal to 300° C.

After an opening that reaches the conductive layer 138c is formed in the insulating layers 140 and 142, the second electrode 144 of the liquid crystal element is formed over the insulating layer 142. The second electrode 144 is electrically connected to the conductive layer 138c through the opening and functions as a common electrode. The second electrode 144 is formed over the entire surface of the pixel portion 102 and has an opening in a region where the transistor 130 is electrically connected to the first electrode 148 formed later. This embodiment shows an example in which the second electrode 144 has an opening that overlaps with the transistor 130. After the second electrode 144 is formed, the insulating layer 146 covering the second electrode 144 is formed. The insulating layer 146 can be formed in a manner similar to that of the insulating layer 124.

Subsequently, an opening that reaches the conductive layer 138a is formed in the insulating layers 140, 142, and 146, and the first electrode 148 of the liquid crystal element is formed over the insulating layer 146. The first electrode 148 is electrically connected to the conductive layer 138a through the opening (FIG. 2F). The first electrode 148 functions as a pixel electrode.

Through the above process, an element formation layer that includes elements such as the transistor 130 and the first and second electrodes of the liquid crystal element can be manufactured over the support substrate 120 with the resin layer 122 positioned therebetween.

Figure 3A:
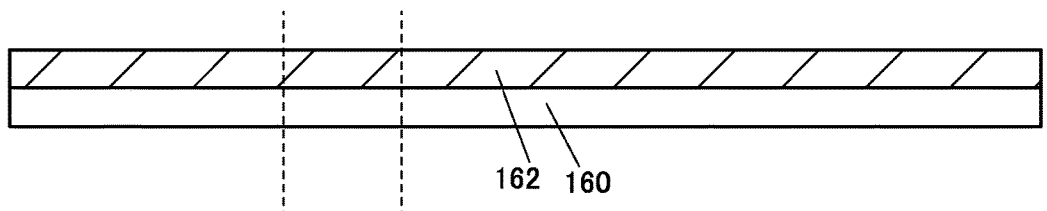
FIGS. 3A to 3C illustrate a method for manufacturing the display device.

An element formation layer that includes a color filter and a black matrix and faces the support substrate 120 is fabricated. First, a resin layer 162 is formed over a support substrate 160 (FIG. 3A).

The support substrate 160 can be formed using a material similar to that of the support substrate 120.

The resin layer 162 can be formed using a material and a process similar to those of the resin layer 122. The resin material contained in the resin layer 162 may be the same as or different from the resin material contained in the resin layer 122. Note that the resin material contained in the resin layer 162 has an upper temperature limit higher than the maximum temperature in the fabrication steps of the color filter and the black matrix. In the display device 100 of this embodiment, the resin layer 162 is positioned on the viewing side of the display element, and therefore, the resin layer 162 (or the resin layer 162b obtained after separation) needs to have a light-transmitting property at least in a region that overlaps with a display region of the display element. Hence, a light-transmitting material is preferably used for the resin layer 162. Alternatively, the resin layer 162b obtained after the separation of the support substrate 160 is preferably thin enough to transmit light. In the case where the resin layer 162b is removed after the separation of the support substrate 160, the resin layer 162 does not need to have a light-transmitting property.

Then, the insulating layer 164 is formed over the resin layer 162. The insulating layer 164 can be formed using a material similar to that of the insulating layer 124. The insulating layer 164 can be used as a barrier layer that prevents diffusion of impurities contained in resin layer 162 into a transistor and a display element; thus, a material with a high barrier property is preferably used.

Note that the display element, the transistors, and the like are preferably provided between the insulating layers 124 and 164 that are formed using films highly resistant to moisture, in which case impurities such as water can be prevented from entering these elements, improving the reliability of the display device.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], and still further preferably lower than or equal to $1\times10^{-8}$ [g/(m$^2$·day)].

Figure 3B:
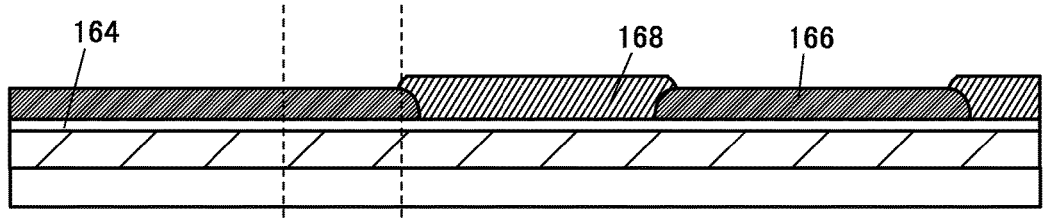

Then, the black matrix 166 and the color filter 168 are formed over the insulating layer 164 (FIG. 3B).

For the black matrix 166, a metal material or a resin material can be used. In the case where a metal material is used, the black matrix 166 can be formed in such a manner that the conductive film is formed and an unnecessary portion is removed by a photolithography method or the like. In the case where a metal material or a photosensitive resin material containing pigment or dye is used, the black matrix 166 can be formed by a photolithography method or the like.

The color filter 168 can be formed with a photosensitive material, thereby being processed into an island-like shape with a photolithography method or the like.

Through the above steps, the element formation layer including the color filter and the black matrix can be formed over the support substrate 160 with the resin layer 162 therebetween. Note that the manufacturing process for the support substrate 120 side and the manufacturing process for the support substrate 160 side can be independently performed, and either process may be performed first. Alternatively, these two processes may be performed in parallel.

Figure 3C:
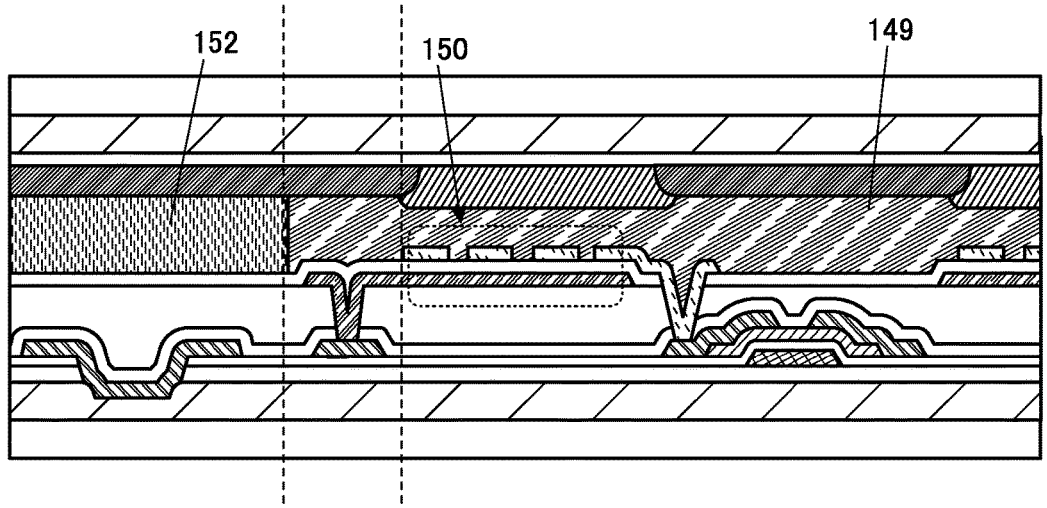

Then, the support substrates 120 and 160 are bonded together with the liquid crystal 149 therebetween. At this time, the resin layer 152 functioning as a sealant is formed to surround the periphery of the pixel portion. The resin layer 152 includes a region that overlaps with the region 123 of the resin layer 122 with the conductive layer 138d therebetween (FIG. 3C).

The resin layer 152 can be formed on the support substrate 120 side or the support substrate 160 side by a screen printing method, a dispensing method, or the like. For the resin layer 152, a thermosetting resin, an ultraviolet curable resin, or the like can be used. Alternatively, a resin that is cured when heated after pre-cured by ultraviolet light, or the like may be used. Alternatively, a thermosetting and ultraviolet curable resin or the like may be used for the resin layer 152.

After the resin layer 152 is formed, the liquid crystal 149 is dropped in a region surrounded by the resin layer 152 by a dispensing method or the like. Then, the support substrates 120 and 160 are bonded together such that the liquid crystal 149 is interposed therebetween, and the resin layer 152 is cured. The bonding is preferably performed in a reduced-pressure atmosphere because air bubbles and the like can be prevented from entering between the support substrate 120 and the support substrate 160.

Note that after the liquid crystal 149 is dropped, a particulate gap spacer may be dispersed in the pixel portion or outside the pixel portion, or the liquid crystal 149 containing the gap spacer may be dropped. The liquid crystal 149 may be injected in a reduced-pressure atmosphere through a space provided in the resin layer 152 after the support substrates 120 and 160 are bonded together.

Figure 4A:
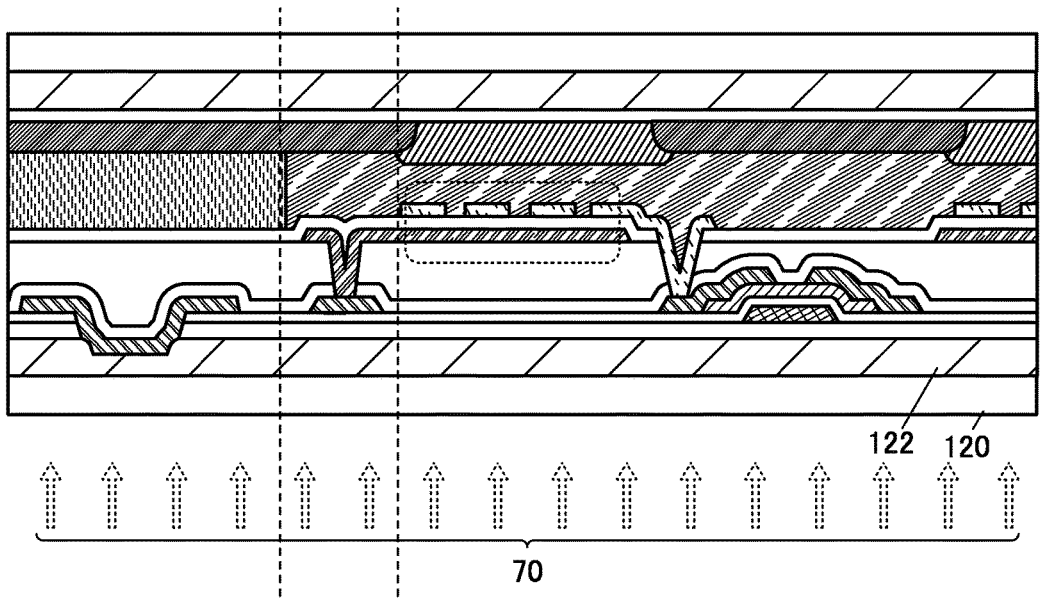
FIGS. 4A and 4B illustrate a method for manufacturing the display device.

Next, as illustrated in FIG. 4A, the resin layer 122 is irradiated with light 70 through the support substrate 120 from the support substrate 120 side. Laser light is suitable for the light 70. In particular, linear laser light is preferable. In the case where linear laser light is used as the light 70, the light 70 is scanned by relatively moving the support substrate 120 and a light source, so that a region to be separated is entirely irradiated with the light 70. Note that a flash lamp or the like may be used as long as light whose energy is as high as that of laser light can be emitted.

The wavelength of the light 70 is determined such that at least part of the light 70 is transmitted through the support substrate 120 and absorbed by the resin layer 122. In particular, the wavelength of the light 70 is preferably in the range from visible light to ultraviolet light. For example, light having a wavelength of greater than or equal to 200 nm and less than or equal to 400 nm, preferably greater than or equal to 250 nm and less than or equal to 350 nm, is preferably used. In particular, an excimer laser having a wavelength of 308 nm is preferably used because the productivity is increased. The excimer laser, which is used also for laser crystallization of low-temperature polysilicon, is preferable because the existing low-temperature polysilicon production line apparatuses can be used and newly capital investment is not necessary. Alternatively, a solid-state UV laser (also referred to as a semiconductor UV laser), such as a UV laser having a wavelength of 355 nm which is the third harmonic of an Nd:YAG laser, may be used. Further alternatively, a pulsed laser such as a picosecond laser may be used.

By the irradiation with the light 70, the vicinity of the surface of the resin layer 122 on the support substrate 120 side or part of the inside of the resin layer 122 is modified and the adhesion between the support substrate 120 and the resin layer 122 is reduced. At this step, when the light is emitted to the entire surface of the resin layer 122, the resin layer 122 can be separated entirely and it is not necessary to cut the periphery of the support substrate 120 by scribing or the like in a subsequent separation step. In contrast, when the periphery of the resin layer 122 has a region not irradiated with the light 70, separation of the resin layer 122 and the support substrate 120 can be suppressed at the irradiation with the light 70 because the region not irradiated with the light 70 has a high adhesion.

Figure 4B:
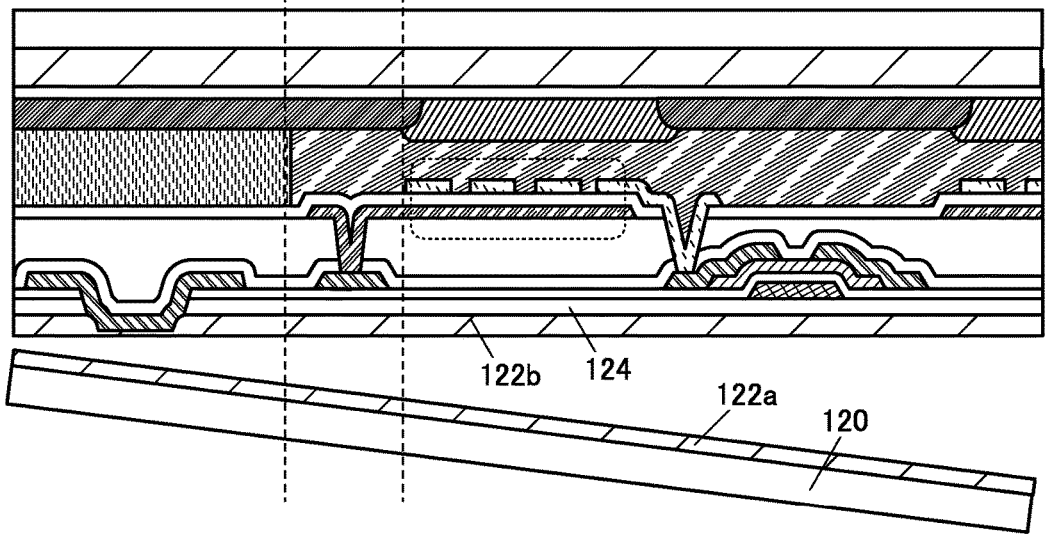

Then, the support substrate 120 and the resin layer 122 are separated (FIG. 4B).

The separation can be performed by applying pulling force in the perpendicular direction to the support substrate 120 while the support substrate 120 is fixed to a stage. For example, part of the top surface of the support substrate 160 is adsorbed and pulled upward, whereby the support substrate 160 can be separated. The stage may have any structure as long as the support substrate 120 can be fixed. For example, the stage may have an adsorption mechanism capable of vacuum adsorption, electrostatic adsorption, or the like or a mechanism physically fastening the support substrate 120.

Alternatively, the separation may be performed while a drum-shaped member with an adhesive surface is pressed against the top surface of the support substrate 160 and the drum-shaped member rotates. At this time, the stage may be moved in the separation direction.

In the case where the region not irradiated with the light 70 is provided on the periphery of the resin layer 122, a notch may be formed in part of the resin layer 122 irradiated with the light 70 to serve as a trigger for separation. The notch can be formed, for example, with a sharp edged tool or a needle-like member or can be formed by cutting the support substrate 120 and the resin layer 122 at the same time by scribing.

FIG. 4B illustrates an example in which the resin layer 122 is divided into a resin layer 122a, which remains on the support substrate 120 side, and a resin layer 122b, which is in contact with the insulating layer 124. Depending on the condition of the irradiation with the light 70, separation (fracture) occurs inside the resin layer 122 and the resin layer 122a remains on the support substrate 120 side in some cases. Also in the case where part of the surface of the resin layer 122 is melted, part of the resin layer 122 sometimes remains on the support substrate 120 side. In the case where separation is performed at the interface between the support substrate 120 and the resin layer 122, the resin layer 122a sometimes does not remain on the support substrate 120 side.

The thickness of the resin layer 122a remaining on the support substrate 120 side can be less than or equal to 100 nm, specifically approximately greater than or equal to 40 nm and less than or equal to 70 nm. The support substrate 120 can be reused by removing the remaining resin layer 122a. For example, in the case where glass is used for the support substrate 120 and a polyimide resin is used for the resin layer 122, the resin layer 122a can be removed by ashing using oxygen plasma, or with fuming nitric acid or the like.

Figure 5A:
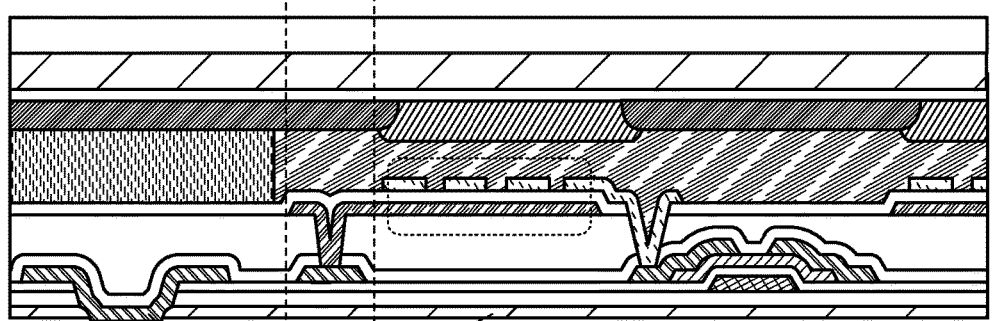
FIGS. 5A to 5C illustrate a method for manufacturing the display device.

Subsequently, the rear surface of the resin layer 122b (the surface opposite to the surface that is in contact with the insulating layer 124) is etched until at least part of the conductive layer 138d is exposed (FIG. 5A). For the etching, either wet etching or dry etching can be used. Alternatively, part of the resin layer 122b may be removed by ashing using oxygen plasma. Note that the ashing using oxygen plasma is suitable for removing part of the resin layer 122b because high controllability and in-plane uniformity are achieved and a large substrate is suitably processed.

The rear surface of the resin layer 122b is etched substantially uniformly. Such uniform etching for planarization is also referred to as etch back. The conductive layer 138d is formed on the region 123 with a smaller thickness in the resin layer 122; therefore, part of the resin layer 122b obtained after the separation of the support substrate 120, which is in contact with the conductive layer 138d, also has a smaller thickness than the other region (e.g., the region where the transistor 130 or the conductive layer 138c is formed). Accordingly, when the resin layer 122b is etched back, the conductive layer 138d can be partly exposed in a self-aligned manner.

In order that the conductive layer 138d functioning as an electrode can be exposed in the opening provided in the resin layer 122b, an opening reaching the support substrate 120 may be formed in the resin layer 122 formed on the support substrate 120 and a conductive layer may be provided in the opening. However, to improve the reliability in the separation step of the support substrate 120 and the resin layer 122, the resin layer 122 is preferably formed on the entire region separated from the support substrate 120, so that the region irradiated with the light 70 can be uniformly separated without separation failure. Accordingly, when the region 123 with a smaller thickness is formed in the resin layer 122 and the conductive layer 138d is provided on the region 123, the reliability in the manufacturing process of the display device can be improved.

In the case where part of the resin layer 122b is removed by ashing using oxygen plasma, the exposed surface of the conductive layer 138d might be oxidized. In that case, the exposed and oxidized part of the conductive layer 138d is preferably removed by etching such as dry etching or wet etching.

In the etching step of the resin layer 122b, the exposed bottom surface of the conductive layer 138d and the etched bottom surface of the resin layer 122b are not aligned easily, and in some etching conditions, the bottom surface of the conductive layer 138d projects from the bottom surface of the resin layer 122b to form a projection. FIG. 5A illustrates an example in which the bottom surface of the conductive layer 138d projects from the bottom surface of the resin layer 122b and a projection is formed.

Figure 5B:
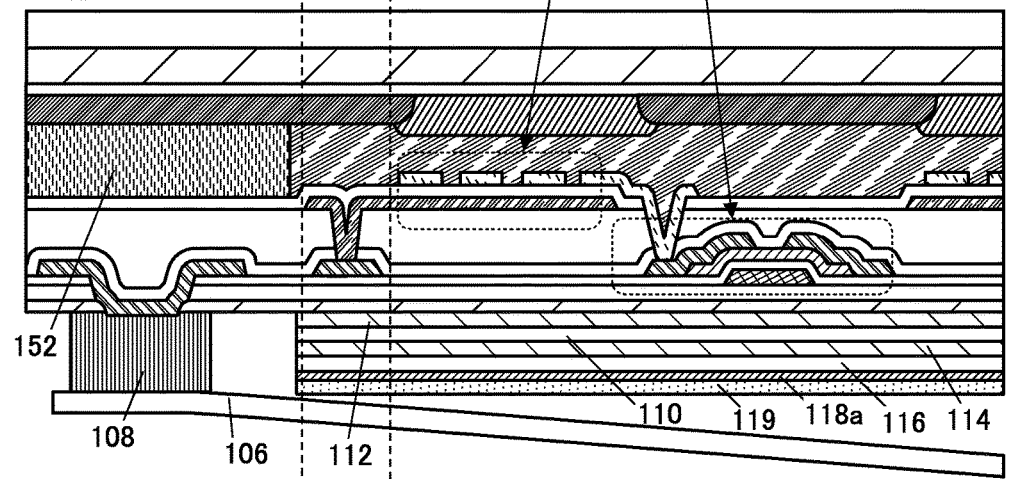

Then, the first substrate 110 is bonded to the resin layer 122b with the adhesive layer 112 (FIG. 5B). Here, the first substrate 110 and the adhesive layer 112 are positioned so as not to overlap with the exposed conductive layer 138d.

A curable material is preferably used for the adhesive layer 112. For example, a photocurable resin, a reactive curable resin, or a thermosetting resin can be used. In particular, a resin material without a solvent is preferably used.

For the first substrate 110, a resin or the like can be used. Specific examples of the resin include a polyester resin such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. The first substrate 110 preferably has flexibility.

Note that the substrate 116 provided with the backlight 119 and the polarizer 118a is preferably bonded in advance to the first substrate 110 bonded to the resin layer 122b with the adhesive layer 114. Alternatively, the substrate 116 provided with the backlight 119 and the polarizer 118a may be bonded to the first substrate 110 with the adhesive layer 114 after the first substrate 110 is bonded to the resin layer 122b. The adhesive layer 114 can be formed using a material similar to that of the adhesive layer 112.

Then, the FPC 106 is bonded to the exposed conductive layer 138d with the connector 108 therebetween by thermocompression bonding, so that the FPC 106 is electrically connected to the conductive layer 138d (FIG. 5B).

As the connector 108, an anisotropic conductive film (ACF), an anisotropic conductive paste (ACP), or the like, which is obtained by mixing metal particles into a thermosetting resin, can be used.

As described above, in the display device of one embodiment of the present invention, the resin layer 152 is provided so as to overlap with the region where the FPC 106 is connected to the terminal portion 104 (the region where the conductive layer 138d is in contact with the connector 108). As a result, the resin layer 152 functions as a buffer layer against pressure applied in the thermocompression bonding step of the FPC 106, whereby damage due to the pressure on the elements such as the transistor 130 and the liquid crystal element 150 or the wiring can be reduced. Since the resin layer 152 also functions as a sealant for sealing the liquid crystal element 150, a highly reliable display device can be fabricated without need of an additional buffer layer against pressure.

In the case where the bottom surface of the conductive layer 138*d* projects from the bottom surface of the resin layer 122*b*, the projecting region is embedded in the connector 108 in the step of mounting the FPC 106, resulting in an increase in the area where the conductive layer 138*d* is in contact with the connector 108. This contributes to favorable conduction between the conductive layer 138*d* and the connector 108. In addition, the region of the conductive layer 138*d* that is embedded in the connector 108 serves as a wedge in the connector 108 (has a so-called anchoring effect). As a result, the adhesion between the conductive layer 138*d* and the connector 108, or the adhesion between the conductive layer 138*d* and the FPC 106 can be increased.

Figure 5C:
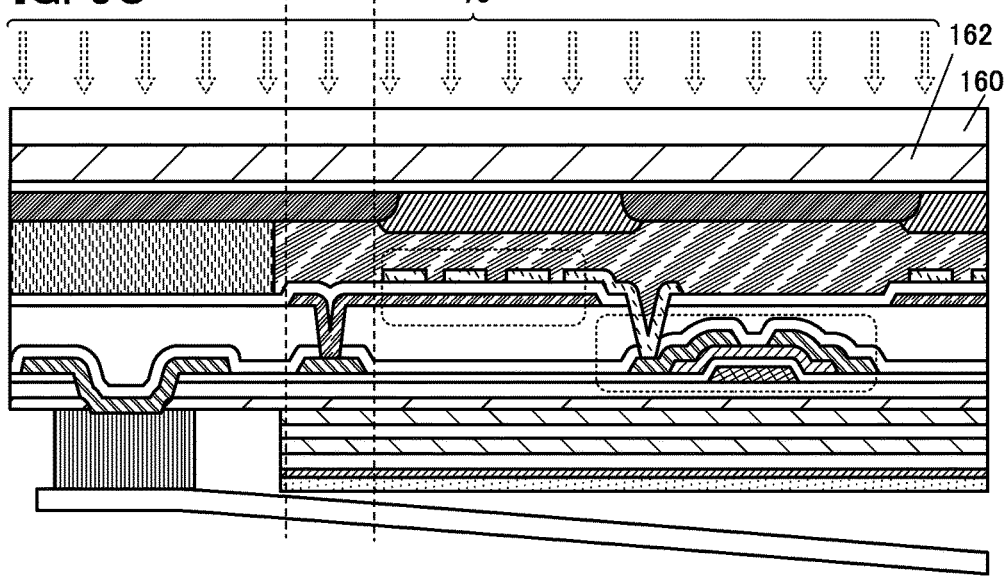

Next, as illustrated in FIG. 5C, the resin layer 162 is irradiated with the light 70 from the support substrate 160 side through the support substrate 160. For the method of irradiation with the light 70, the above description can be referred to.

Figure 6A:
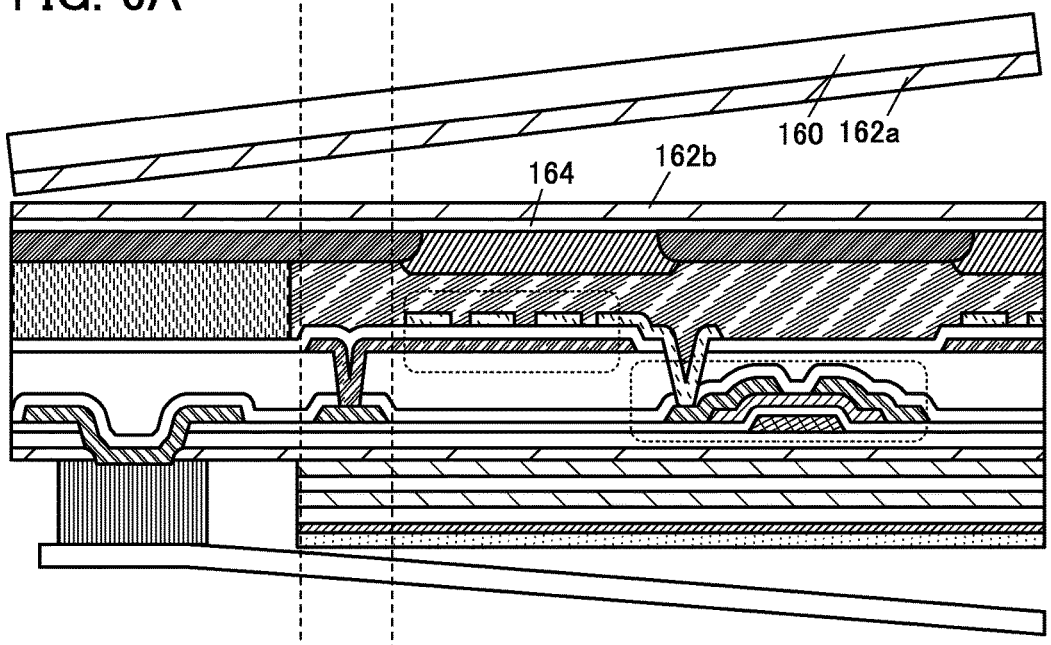
FIGS. 6A and 6B illustrate a method for manufacturing the display device.

Then, the support substrate 160 and the resin layer 162 are separated (FIG. 6A). For the separation of the support substrate 160 and the resin layer 162, the description on the separation between the support substrate 120 and the resin layer 122 can be referred to. FIG. 6A illustrates an example in which a resin layer 162*a* remains on the support substrate 160 side and a resin layer 162*b* is in contact with the insulating layer 164.

Figure 6B:
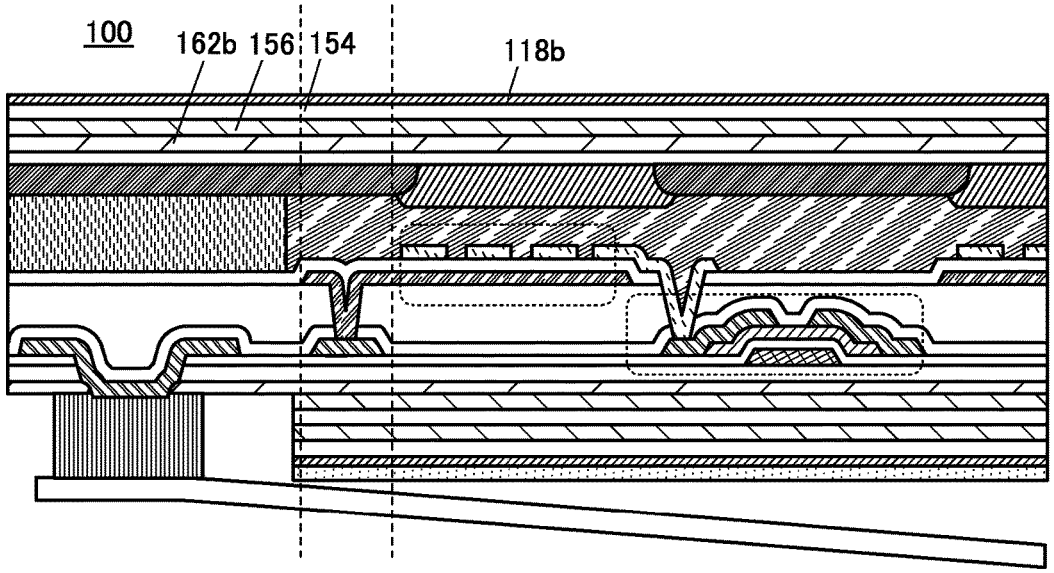

Next, the second substrate 154 is bonded to the resin layer 162*b*, which is exposed by the separation, with the adhesive layer 156 therebetween (FIG. 6B). The polarizer 118*b* may be formed on the second substrate 154 before or after the bonding of the second substrate 154.

The adhesive layer 156 may have a structure similar to that of the adhesive layer 112. The second substrate 154 may have a structure similar to that of the first substrate 110. Note that in this embodiment, the second substrate 154 is positioned on the viewing side of the display device, and therefore, the second substrate 154 needs to have a light-transmitting property at least in a region that overlaps with the pixel portion 102.

The resin layer 162*b* in contact with the insulating layer 164 may be removed before the adhesive layer 156 is provided, so that the adhesive layer 156 is in contact with the insulating layer 164. In that case, the resin layer 162 (or the resin layer 162*b*) does not need to have a light-transmitting property.

Through the above steps, the display device 100 of this embodiment can be manufactured. In the display device 100 of one embodiment of the present invention, the region where the conductive layer 138*d* in the terminal portion 104 is electrically connected to the FPC 106 is positioned so as to overlap with the resin layer 152. This allows the resin layer 152 to function as a buffer against pressure applied in the thermocompression bonding step of the FPC 106. Accordingly, the element, the wiring, and the like can be prevented from being damaged by pressure applied in the thermocompression bonding of the FPC 106, so that the reliability of the display device 100 can be increased.

Furthermore, since the FPC 106 is positioned on the side opposite to the display surface, the display device 100 can be incorporated into an electronic device without needing a space where the FPC 106 is folded, achieving a smaller-size electronic device.

In addition, since the region where the conductive layer 138*d* is connected to the FPC 106 is positioned so as to overlap with the resin layer 152, the pixel portion 102 can be formed in a larger region and the frame width of the display device 100 can be reduced.

Note that this embodiment can be combined with the other embodiments as appropriate.

Embodiment 2

In this embodiment, the display device of one embodiment of the present invention, which has a structure different from that in Embodiment 1, will be described with reference to FIGS. 7A and 7B. Specifically, structure examples of the display device that includes a light-emitting element as the display element will be described.

<Structure Example 2 of Display Device>

Figure 7A:
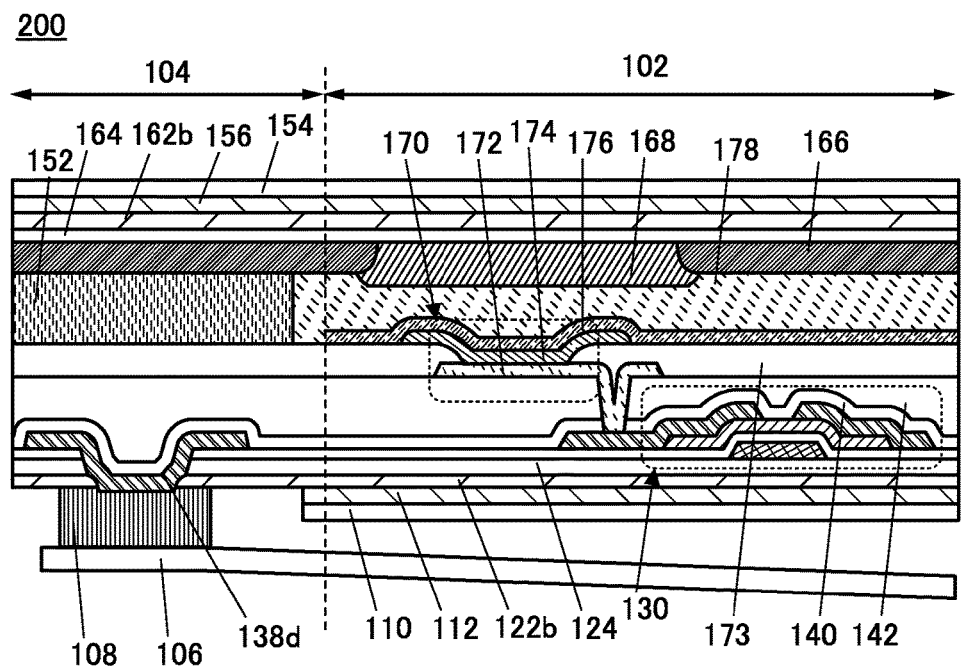
FIGS. 7A and 7B are cross-sectional views illustrating structure examples of a display device.

FIG. 7A is a cross-sectional view illustrating part of the pixel portion 102 and the terminal portion 104 of a display device 200 in this embodiment. The plan view of the display device 200 can be similar to that of FIG. 1A. The display device 200 in FIG. 7A is different from the display device 100 in Embodiment 1 in that a light-emitting element 170 is provided instead of the liquid crystal element 150.

In the display device 200, a conductive layer 172 functioning as a pixel electrode is formed over the insulating layer 142. The conductive layer 172 is electrically connected to the source or drain electrode of the transistor 130 through an opening formed in the insulating layers 140 and 142.

An insulating layer 173 that covers an end portion of the conductive layer 172 is formed over the conductive layer 172. The insulating layer 173 can be formed using an organic insulating film or an inorganic insulating film that can be used for the insulating layer 124.

An EL layer 174 that is in contact with part of the conductive layer 172 is formed over the insulating layer 173. As the EL layer 174, an organic EL layer or an inorganic EL layer can be used. Alternatively, a light-emitting diode (LED) may be used. The EL layer 174 can be formed by an evaporation method, a coating method, a printing method, a discharge method, or the like. In the case where the EL layer 174 is formed for each individual pixel, an evaporation method using a shadow mask such as a metal mask, an ink-jet method, or the like can be used. In the case where the EL layer 174 is shared by some pixels, an evaporation method not using a metal mask can be used.

A conductive layer 176 is formed on and in contact with the EL layer 174. Part of the conductive layer 176 functions as a common electrode. The light-emitting element 170 is constituted by a stacked structure of the conductive layer 172, which partly functions as a pixel electrode, the EL layer 174, and the conductive layer 176, which partly functions as a common electrode.

In the display device 200, a space between the light-emitting element 170 and each of the color filter 168 and the black matrix 166 is filled with a resin 178 having a light-transmitting property. The resin 178 has at least one of a function as an adhesive layer between the element on the resin layer 122*b* side (e.g., the transistor 130 and the light-emitting element 170) and the element on the resin layer 162*b* side (e.g., the color filter 168 and the black matrix 166), a function of maintaining the surface of the light-emitting element 170 parallel to the surface of the substrate 154, and a function of preventing reflection or refraction at the interface between the light-emitting element 170 and the substrate 154.

As the resin 178, specifically, an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used. In particular, a material with low moisture permeability, such as an epoxy resin, is preferred. Alternatively, a two-component type resin may be used.

Furthermore, the resin may contain a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably contained because it can prevent impurities such as moisture from entering the element, thereby improving the reliability of the display device.

In addition, a filler with a high refractive index or a light-scattering member may be mixed with the resin, in which case the light extraction efficiency can be improved. For example, titanium oxide, barium oxide, zeolite, or zirconium oxide can be used.

The viscosity of the resin 178 before curing is preferably lower than that of the resin layer 152 before curing. With such a mode, after the closed-loop resin layer 152 is formed, the closed loop can be easily filled with the resin 178 with a relatively low viscosity.

Note that the resin 178 is not necessarily provided, and an inert gas such as nitrogen or a rare gas may be sealed instead of the resin 178.

The other structures of the display device 200 can be similar to those of the display device 100 shown in Embodiment 1.

<Structure Example 3 of Display Device>

Figure 7B:
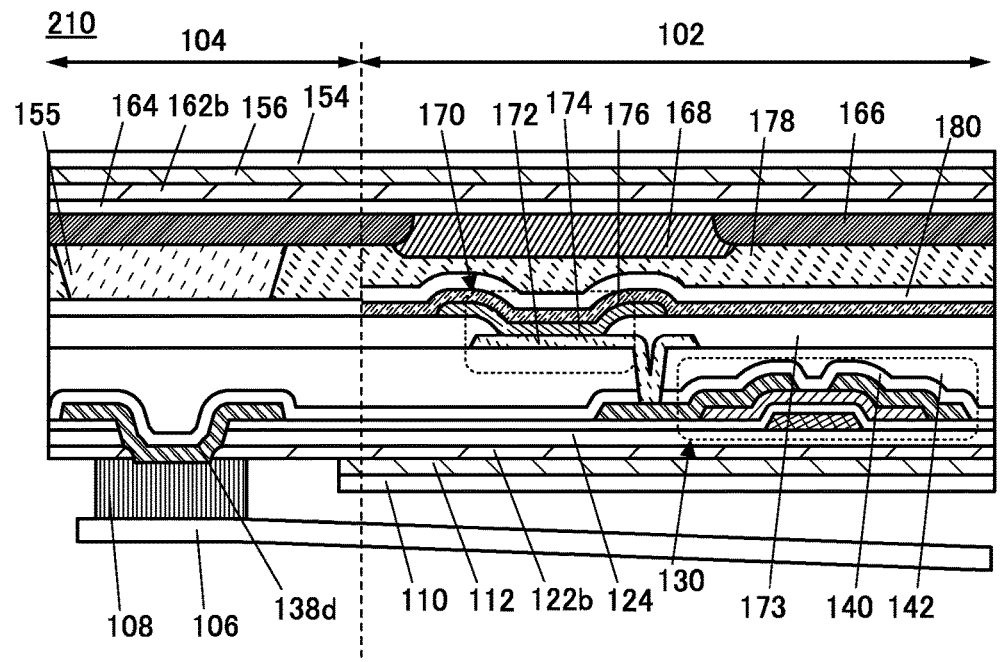

FIG. 7B is a cross-sectional view illustrating part of the pixel portion 102 and the terminal portion 104 of a display device 210 in this embodiment. The plan view of the display device 210 can be similar to that in FIG. 1A. The display device 210 in FIG. 7B is different from the display device 200 in FIG. 7A in that the light-emitting element 170 is not sealed by the resin layer 152 and the resin 178 but is sealed by an insulating layer.

The display device 210 illustrated in FIG. 7B includes an insulating layer 180 over the light-emitting element 170. The insulating layer 180 functions as a protective layer that prevents diffusion of impurities such as water into the light-emitting element 170. As the insulating layer 180, an inorganic insulating film, particularly a dense inorganic insulating film that is formed at high temperatures is preferably formed because the film can have a high barrier property and can prevent the diffusion of impurities. Alternatively, the insulating layer 180 may have a stacked structure in which an inorganic insulating film is formed in contact with the light-emitting element 170 and an organic insulating film is formed over the inorganic insulating film.

As the inorganic insulating layer used as the insulating layer 180, specifically, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used.

Note that in the case where the insulating layer 180 is provided over the light-emitting element 170, a sealant (the resin layer 152) for sealing the light-emitting element 170 is not necessarily provided. However, a resin layer that overlaps with the conductive layer 138d in the terminal portion 104 needs to be formed in order to reduce pressure applied in the thermocompression bonding of the FPC 106. In the display device 210, as an example, a spacer-type resin layer 155 is provided instead of the resin layer functioning as a sealant.

The resin layer 155 only needs to be provided in a region overlapping with the region where the conductive layer 138d is connected to the FPC 106. The resin layer 155 may function not only as a buffer in the thermocompression bonding of the FPC 106 but also as a spacer for maintaining the distance between the support substrate 120 and the support substrate 160 constant. In that case, the resin layer 155 may be provided not only in the region where the conductive layer 138d is connected to the FPC 106 but also in a region of the pixel portion 102 that overlaps with the black matrix 166.

The resin layer 155 can be formed using a material and a process similar to those of the resin layer 152.

The other structures of the display device 210 can be similar to those of the display device 100 or 200.

The display devices 200 and 210 described above in this embodiment are EL display devices that include light-emitting elements as display elements. In the EL display devices of one embodiment of the present invention, the region where the conductive layer 138d is electrically connected to the FPC 106 in the terminal portion 104 is positioned so as to overlap with the resin layer, so that the element, the wiring, and the like can be prevented from being damaged by pressure applied in the thermocompression bonding of the FPC 106. Accordingly, the EL display device of one embodiment of the present invention can be a highly reliable display device.

Furthermore, since the FPC 106 is positioned on the side opposite to the display surface, the EL display device can be incorporated into an electronic device without needing a space where the FPC 106 is folded, achieving a smaller-size electronic device.

Note that this embodiment can be combined with the other embodiments as appropriate.

Embodiment 3

In this embodiment, other structure examples of the terminal portion that can be used in the display device of one embodiment of the present invention will be described with reference to FIGS. 8A to 8D.

Figure 8A:
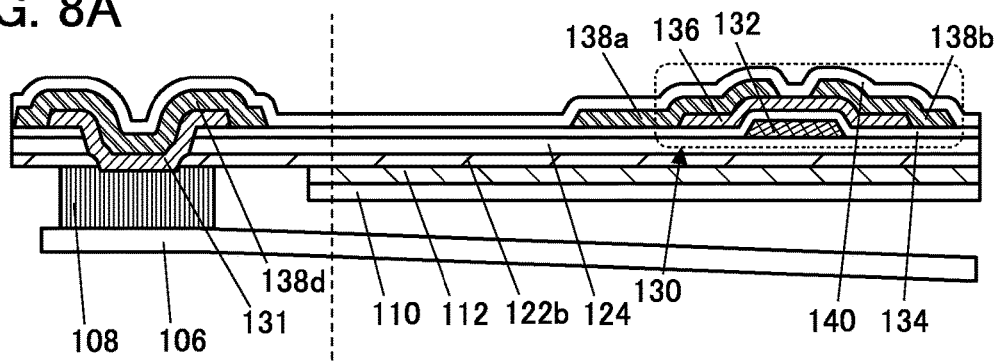
FIGS. 8A to 8D illustrate structure examples of a terminal portion.

FIG. 8A illustrates an example in which a conductive layer functioning as an electrode of the terminal portion has a stacked structure of a conductive layer 131 and the conductive layer 138d. In FIG. 8A, the conductive layer 131, which is provided in openings of the insulating layers 124 and 134, has a region that is exposed in the opening in the resin layer 122b and is in contact with the connector 108. The conductive layer 131 is electrically connected to the FPC 106 through the connector 108. In addition, the conductive layer 138d is formed over the conductive layer 131 to cover the conductive layer 131.

An oxide conductive layer is preferably used as the conductive layer 131 that includes the region exposed in the opening in the resin layer 122b. This is because in the case where part of the resin layer 122b is removed by ashing using oxygen plasma to expose the conductive layer 131, the use of the oxide conductive layer as the conductive layer 131 can prevent a decrease in conductivity due to the oxidation of the exposed surface of the conductive layer 131. The oxide conductive layer that can be used as the conductive layer 131 can be formed using indium oxide, indium tin oxide, indium zinc oxide, zinc oxide, zinc oxide to which gallium is added, or the like.

In the case where the oxide semiconductor layer 136 is used as the semiconductor layer of the transistor 130 provided over the resin layer 122b, the conductive layer 131 may be formed with the same layer as the oxide semiconductor layer 136. The oxide semiconductor is a semiconductor material whose resistance can be controlled by oxygen vacancies in a film of the oxide semiconductor and/or the concentration of impurities (typically, hydrogen, water, or the like) in the film of the oxide semiconductor. Thus, the resistivity of the oxide semiconductor layer can be controlled by selecting between treatment for increasing oxygen vacancies and/or impurity concentration in the oxide semiconductor layer, or treatment for reducing oxygen vacancies and/or impurity concentration in the oxide semiconductor layer. As a result, the formed oxide semiconductor layer can have a reduced resistance and can be used as an oxide conductive layer.

The conductive layer 131 that is formed with the same layer as the oxide semiconductor layer 136 is a semiconductor layer immediately after deposition; for example, its resistivity might be reduced when at least one of hydrogen and nitrogen is supplied to the conductive layer 131 in the formation process of the conductive layer 138d on and in contact with the conductive layer 131. The resistivity of the conductive layer 131 might be reduced also when oxygen in the conductive layer 131 is extracted by the conductive layer 138d on and in contact with the conductive layer 131. The resistivity of the conductive layer 131 might be reduced also when a constituent element of the conductive layer 138d enters the conductive layer 131. Note that the resistivity of a region in the oxide semiconductor layer 136 of the transistor 130 that is in contact with the conductive layer 138a or 138b functioning as a source or a drain might be reduced by extraction of oxygen, entering of a constituent element of the conductive layer 138a or 138b, or the like. In that case, the region with a reduced resistance can function as a source region or a drain region.

In the case where the conductive layer 131 is the layer that is formed with the same layer as the oxide semiconductor layer 136 and has a reduced resistance, the resistivity of the oxide semiconductor layer used as the conductive layer 131 can be adjusted by a method other than the above methods. For example, plasma treatment using a gas containing one or more kinds selected from a rare gas (He, Ne, Ar, Kr, or Xe), hydrogen, boron, phosphorus, and nitrogen, can be employed. For example, when plasma treatment is performed in an Ar atmosphere, a mixed gas atmosphere of Ar and nitrogen, a mixed gas atmosphere of Ar and hydrogen, an ammonia atmosphere, a mixed gas atmosphere of Ar and ammonia, or a nitrogen atmosphere, the carrier density of the oxide semiconductor layer can be increased and the resistivity thereof can be reduced.

The resistivity of the oxide semiconductor layer can also be reduced when hydrogen, boron, phosphorus, or nitrogen is injected into the oxide semiconductor layer by an ion implantation method, an ion doping method, a plasma immersion ion implantation method, or the like.

The conductive layer 131 with a high carrier density and a low resistivity can also be formed by a method in which a film containing at least one of hydrogen and nitrogen is formed in contact with the oxide semiconductor layer and at least one of hydrogen and nitrogen is diffused from the film into the oxide semiconductor layer.

Hydrogen contained in the oxide semiconductor layer reacts with oxygen bonded to a metal atom to be water, and also causes oxygen vacancies in a lattice from which oxygen is released (or a portion from which oxygen is released). Entry of hydrogen into the oxygen vacancies generates an electron serving as a carrier in some cases. Furthermore, in some cases, bonding of part of hydrogen to oxygen bonded to a metal atom causes generation of an electron serving as a carrier. Thus, the oxide semiconductor layer can have a high carrier density and a low resistivity.

In the case where heat treatment is performed in the manufacturing process of the display device, oxygen is released from the oxide semiconductor layer by heating the oxide semiconductor layer, so that oxygen vacancies might be increased. Thus, the resistivity of the oxide semiconductor layer can be reduced.

Note that such an oxide conductive layer formed using an oxide semiconductor layer can be referred to as an oxide semiconductor layer having a high carrier density and a low resistivity, an oxide semiconductor layer having conductivity, or an oxide semiconductor layer having high conductivity.

Note that as mentioned above, the insulating layer 140 covering the conductive layer 138d is preferably formed with a stack of an oxide insulating film that releases oxygen and an insulating film with low oxygen diffusibility and low oxygen permeability. When such a stack is heated, oxygen can be supplied to the oxide semiconductor layer 136 of the transistor 130, oxygen vacancies in the oxide semiconductor layer 136 can be filled, and defects at the interface between the oxide semiconductor layer 136 and the insulating layer 140 can be repaired, leading to a reduction in defect levels. In contrast, it is preferable that the conductive layer 131 not be in contact with the insulating layer 140 in order to maintain the conductivity of the conductive layer 131. The conductive layer 131 is covered with the conductive layer 138d in FIG. 8A; hence, the resistance of the conductive layer 131 is maintained low.

The oxide semiconductor layer including the channel formation region of the transistor and the conductive layer 131 are preferably formed using the same material and process to reduce the manufacturing costs. Note that even when the oxide semiconductor layer and the conductive layer 131 have the same metal elements, the compositions of the metal elements are different in some cases. For example, a metal element is released from the film during the fabrication process of the transistor and the capacitor, which might result in different metal compositions.

Figure 8B:
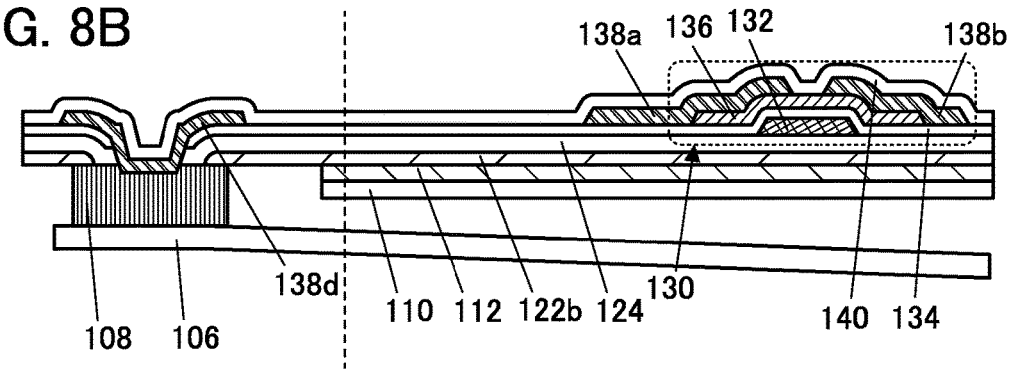

FIG. 8B illustrates another structure example of the terminal portion, in which the opening in the resin layer 122b is covered with the insulating layers 124 and 134. The structure illustrated in FIG. 8B is obtained in such a manner that the opening in the insulating layers 124 and 134 is formed in the region 123 of the resin layer 122 in FIG. 2D.

When the opening in the resin layer 122b is covered by the insulating layer 124 and/or the insulating layer 134, the insulating layer(s) can function as a barrier layer against impurities such as water, thereby preventing the entry of the impurities through the opening in the resin layer 122b. As a result, the reliability of the display device can be improved. In contrast, when the conductive layer 138d or 131 is formed in contact with the opening in the resin layer 122b as illustrated in FIGS. 2A to 2F and the like, the area connected to the connector 108 can be increased to make favorable connection with the FPC 106, or the equivalent connection region can be obtained with a smaller area of the terminal portion.

Note that FIG. 8B shows, but is not limited to, an example in which the opening in the resin layer 122b is covered with the insulating layers 124 and 134. For example, the opening in the resin layer 122b may be covered only with the insulating layer 124 or with the insulating layer 134.

Figure 8C:
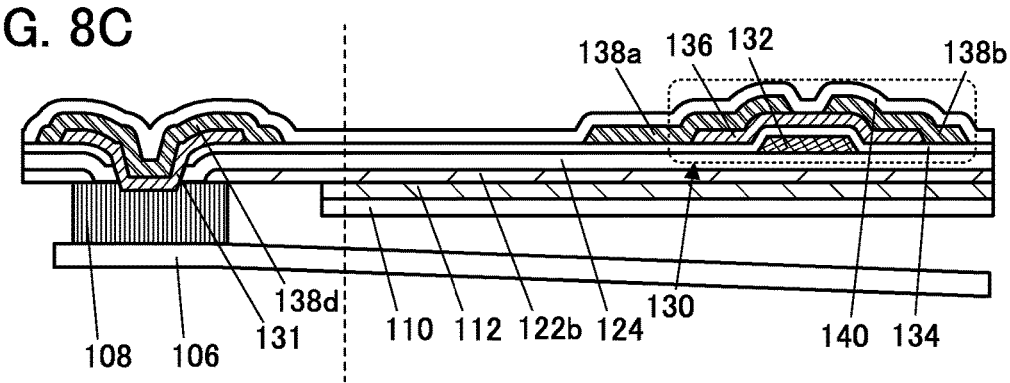

FIG. 8C illustrates another structure of the terminal portion, which is different from that in FIG. 8A in that the opening in the resin layer 122b is covered with the insulating layers 124 and 134. With the structure illustrated in FIG. 8C, the entry of impurities such as moisture through the opening in the resin layer 122b can be prevented. In the case where part of the resin layer 122b is removed by ashing using oxygen plasma to expose the conductive layer 131, the use of an oxide conductive layer as the conductive layer 131 can prevent decrease in conductivity due to the oxidation of the exposed surface of the conductive layer 131.

Figure 8D:
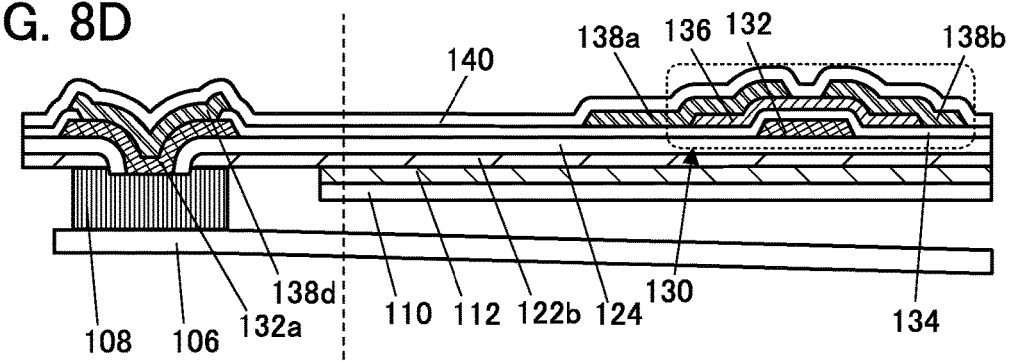

FIG. 8D illustrates a structure in which the electrode of the terminal portion has a stacked structure of a conductive layer 132a, which is the same layer as the conductive layer 132 functioning as the gate of the transistor 130, and the conductive layer 138d, which is the same layer as the conductive layers 138a and 138b functioning as the source and the drain. The stacked structure of the conductive layers 132a and 138d contributes to a decrease in the electrical resistance of the electrode of the terminal portion.

An oxide conductive layer is preferably used as the conductive layer 132a. This is because in the case where part of the resin layer 122b is removed by ashing using oxygen plasma to expose the conductive layer 132a, a decrease in conductivity due to the oxidation of the exposed surface of the conductive layer 132a can be prevented. In the case where an oxide conductive layer is used as the conductive layers 132a and 132, the resistance of an oxide semiconductor layer may be reduced after deposition to be an oxide conductive layer.

FIG. 8D illustrates an example in which the opening in the resin layer 122b is covered with the insulating layer 124. The opening in the resin layer 122b can be covered with the insulating layer 124 in such a manner that, for example, the opening in the insulating layer 124 is formed in the region 123 of the resin layer 122 after forming the insulating layer 124. Alternatively, part of the conductive layer 132a may be exposed in such a manner that an opening reaching the support substrate 120 is formed in the resin layer 122 instead of the region 123, the insulating layer 124 is formed to cover the opening, the support substrate 120 is separated, and the insulating layer 124 exposed in the rear surface of the resin layer 122b is etched.

Note that any of the structures of the terminal portion shown in this embodiment can be combined. For example, in FIG. 8D, the opening in the resin layer 122b may be in contact with the conductive layer 132a, or the electrode of the terminal portion may have a stacked structure of the conductive layers 132a, 131, and 138d.

Although not illustrated, in the case where a liquid crystal element is used as the display element in the display device including the terminal portion illustrated in FIGS. 8A to 8D, a polarizer, a backlight, and the like can be provided as appropriate.

Note that this embodiment can be combined with the other embodiments as appropriate.

Embodiment 4

In this embodiment, other structure examples of the transistor that can be used in the display device of one embodiment of the present invention will be described with reference to FIGS. 9A to 9C. For the materials and formation methods of the components of the transistors illustrated in FIGS. 9A to 9C, which have functions similar to those in Embodiment 1, the description of Embodiment 1 can be referred to.

Figure 9A:
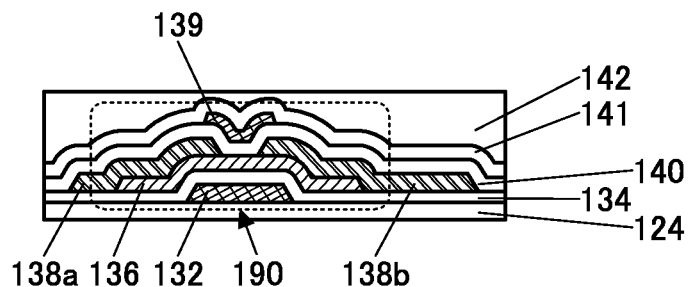
FIGS. 9A to 9C illustrate transistors that can be used in a display device.

A transistor 190 illustrated in FIG. 9A is different from the transistor 130 in that a conductive layer 139 and an insulating layer 141 are provided. The conductive layer 139 is provided over the insulating layer 140 and includes a region overlapping with the oxide semiconductor layer 136. The insulating layer 141 covers the conductive layer 139 and the insulating layer 140.

The conductive layer 139 is positioned to face the conductive layer 132 with the oxide semiconductor layer 136 interposed therebetween, and can function as a second gate electrode of the transistor 190. When the same potential is supplied to the conductive layers 132 and 139 in this structure, the on-state current of the transistor 190 can be increased. When a potential for controlling the threshold voltage is supplied to one of the conductive layers 132 and 139 and a potential for driving is supplied to the other, the threshold voltage of the transistor can be controlled.

A conductive material including an oxide is preferably used for the conductive layer 139. When a conductive film to be the conductive layer 139 is formed in an atmosphere containing oxygen, oxygen can be supplied to the insulating layer 140. The proportion of an oxygen gas in a film formation gas is preferably higher than or equal to 90% and lower than or equal to 100%. Oxygen supplied to the insulating layer 140 is supplied to the oxide semiconductor layer 136 by heat treatment performed later, so that oxygen vacancies in the oxide semiconductor layer 136 can be reduced.

It is particularly preferable to use, as the conductive layer 139, an oxide semiconductor whose resistance is reduced. In this case, the insulating layer 141 is preferably formed using an insulating film that releases hydrogen, for example, a silicon nitride film. Hydrogen is supplied to the conductive layer 139 during the formation of the insulating layer 141 or by heat treatment performed after that, whereby the electrical resistance of the conductive layer 139 can be reduced effectively.

Figure 9B:
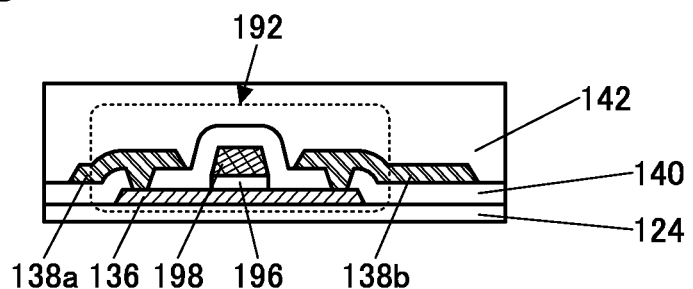

A transistor 192 illustrated in FIG. 9B is a top-gate transistor.

The transistor 192 includes the oxide semiconductor layer 136, which is formed over the insulating layer 124, an insulating layer 196 over the oxide semiconductor layer 136, and a conductive layer 198 overlapping with the oxide semiconductor layer 136 with the insulating layer 196 therebetween. The insulating layer 140 covers the top surface and side end portions of the oxide semiconductor layer 136, side surfaces of the insulating layer 196, and the conductive layer 198. The conductive layers 138a and 138b are provided over the insulating layer 140. The conductive layers 138a and 138b are electrically connected to the oxide semiconductor layer 136 through openings provided in the insulating layer 140.

In the example shown here, the insulating layer 196 is processed with the conductive layer 198 used as a mask, and the top surface shape of the insulating layer 196 is substantially the same as the top surface shape of the conductive layer 198. Alternatively, the insulating layer 196 may be provided to cover the top surface and side end portions of the oxide semiconductor layer 136.

In the transistor 192, the physical distance between the conductive layer 198 and the conductive layer 138a or 138b can be easily increased, so that the parasitic capacitance therebetween can be reduced.

Figure 9C:
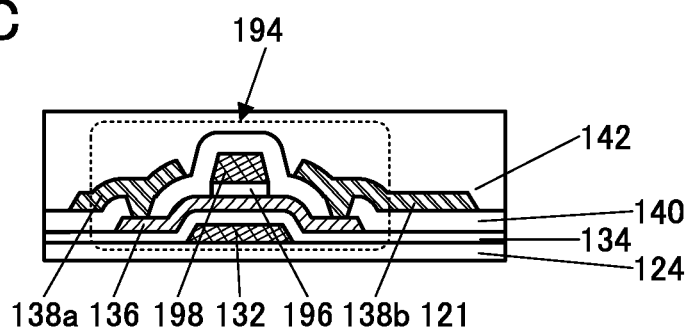

A transistor 194 illustrated in FIG. 9C is different from the transistor 192 in that the conductive layer 132 and the insulating layer 134 are provided. The conductive layer 132 is provided over the insulating layer 124 and includes a region overlapping with the oxide semiconductor layer 136. The insulating layer 134 covers the conductive layer 132 and the insulating layer 124.

The conductive layer 132 can function as a second gate electrode of the transistor like the conductive layer 139. Thus, the on-state current can be increased and the threshold voltage can be controlled, for example.

Note that this embodiment can be combined with the other embodiments as appropriate.

Embodiment 5

In this embodiment, structure examples the display device, which are different from those shown in the other embodiments, will be described with reference to FIGS. 10A and 10B.

Figure 10A:
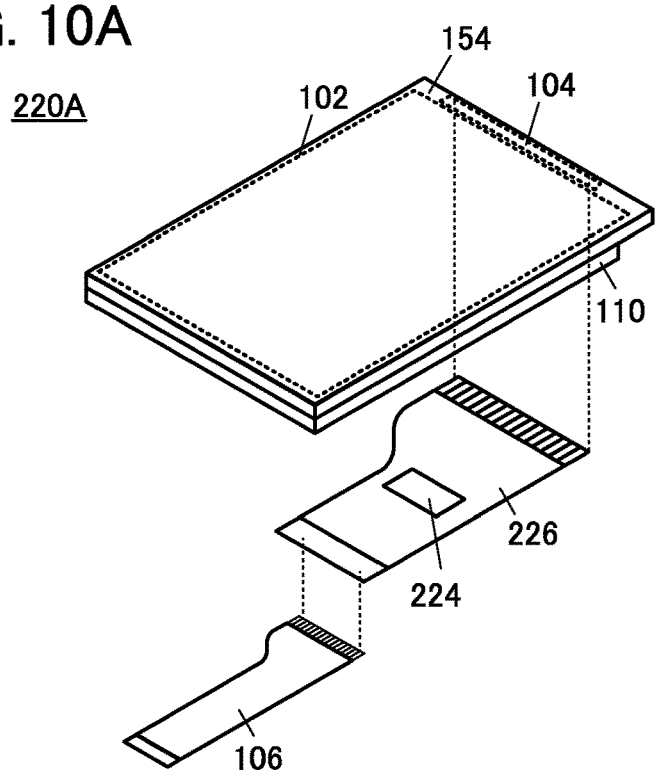
FIGS. 10A and 10B illustrate structure examples of a display device.

FIG. 10A is a perspective view illustrating a structure example of a display device 220A of this embodiment. The display device 220A includes the pixel portion 102 sealed between the first substrate 110 and the second substrate 154, the terminal portion 104, a substrate 226 that includes an IC chip 224 electrically connected to the terminal portion 104, and the FPC 106 electrically connected to the IC chip 224. In the display device 220A, an electrode of the terminal portion 104 is electrically connected to a wiring of the IC chip 224 that is positioned on one end of the substrate 226, and a wiring of the IC chip 224 that is positioned on another end of the substrate 226 is electrically connected to the FPC 106, so that the terminal portion 104 is electrically connected to the FPC 106.

In the display device 220A, the IC chip 224 is mounted on the substrate 226 as an external peripheral driver circuit. The wiring of the IC chip 224 is electrically connected to the electrode of the terminal portion 104 through a connector such as an anisotropic conductive film (ACF) or an anisotropic conductive paste (ACP). When the IC chip 224 is provided on the substrate 226, the area of the pixel portion 102 can be large as compared with the case where a driver circuit such as a gate driver circuit or a source driver circuit is provided above the first substrate 110, whereby the frame width of the display device can be reduced.

In addition, since the FPC 106 is mounted through the substrate 226 including the IC chip 224 in the display device 220A, the size of the FPC can be small as compared with the case where the FPC 106 including an IC chip is connected to the terminal portion 104. Accordingly, the display device 220A can be incorporated into an electronic device while reducing the space where the FPC 106 is folded, achieving a smaller-size electronic device.

In the case where an external IC chip as a driver circuit of the pixel portion 102 and an FPC are mounted, the terminal portion needs a wide margin for mounting the IC chip and the FPC. When the FPC 106 is mounted through the substrate 226 including the IC chip 224 as illustrated in FIGS. 10A and 10B, the necessary margin of the terminal portion 104 can be reduced. Such a structure is particularly effective when a plurality of IC chips are mounted. Note that the FPC 106 may include an IC chip.

Figure 10B:
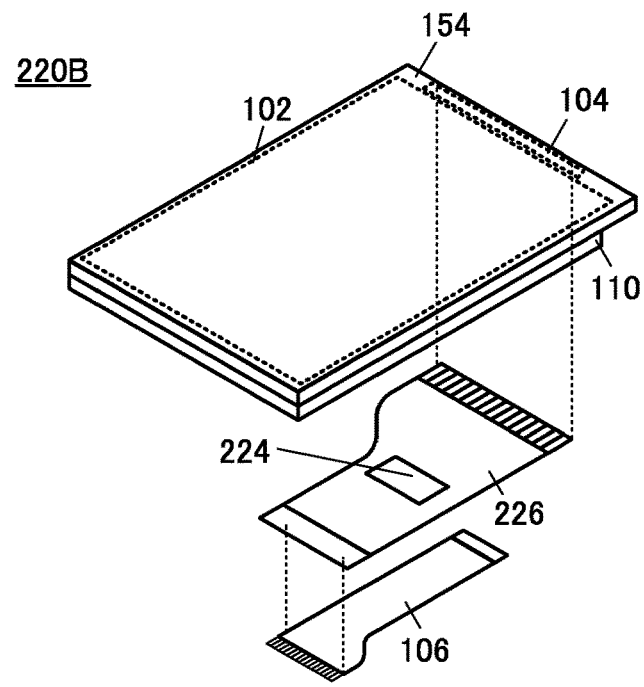

The position of the FPC 106 is not limited to that in FIG. 10A; for example, as in a display device 220B illustrated in FIG. 10B, one end of the FPC 106 that is opposite to the end connected to the substrate 226 may be closer to the terminal portion 104.

In the case where the display devices 220A and 220B shown in this embodiment include sensors such as touch sensors, a sensor driver circuit may be mounted as the IC chip 224. In the display devices 220A and 220B shown in this embodiment, the substrate 226 can be formed using any of the materials that can be used for the substrate 110.

Note that this embodiment can be combined with the other embodiments as appropriate.

Embodiment 6

In this embodiment, electronic devices that can be manufactured with one embodiment of the present invention will be described with reference to FIGS. 11A to 11F.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The electronic device of one embodiment of the present invention can be incorporated along a curved inside/outside wall surface of a house or a building or a curved interior/exterior surface of a car.

The electronic device of one embodiment of the present invention may include a secondary battery. Preferably, the secondary battery is capable of being charged by contactless power transmission.

Examples of the secondary battery include a lithium-ion secondary battery such as a lithium polymer battery (lithium ion polymer battery) using a gel electrolyte, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays).

The electronic device of one embodiment of the present invention can have a variety of functions, for example, a function of displaying a variety of information (e.g., a still image, a moving image, and a text image) on a display portion, a touch panel function, a function of displaying a calendar, date, time, and the like, a function of executing a variety of software (programs), a wireless communication function, and a function of reading a program or data stored in a recording medium.

Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of taking a still image or a moving image, a function of automatically or manually correcting a photographed image, a function of storing a photographed image in a recording medium (an external recording medium or a recording medium incorporated in the electronic device), a function of displaying a photographed image on a display portion, or the like. Note that the functions of the electronic device of one embodiment of the present invention are not limited thereto, and the electronic devices can have a variety of functions.

Figure 11A:
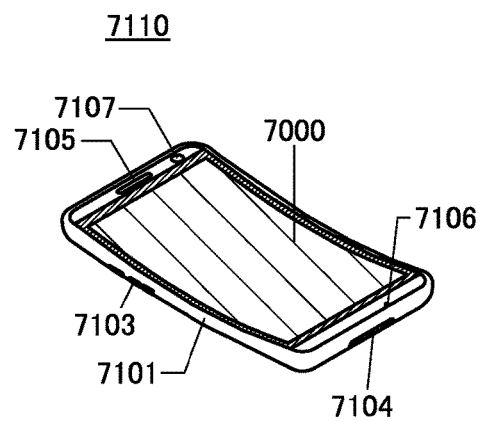
FIGS. 11A to 11F illustrate electronic devices.
Figure 11B:
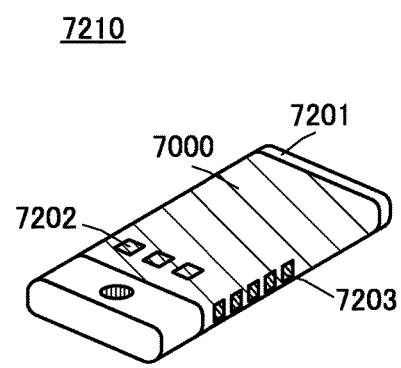
Figure 11C:
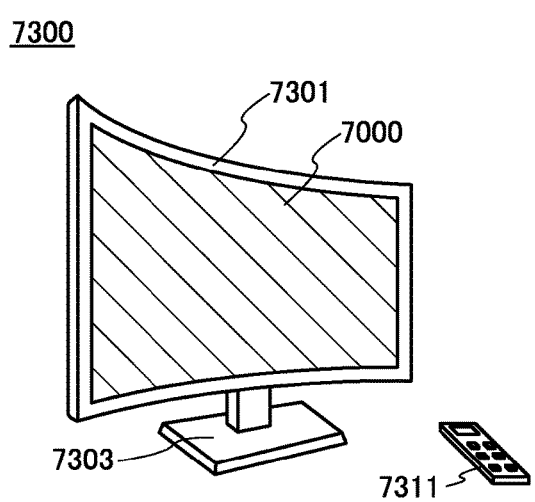

FIGS. 11A to 11C illustrate examples of an electronic device including a display portion 7000 with a curved surface. The display surface of the display portion 7000 is curved, and images can be displayed on the curved display surface. The display portion 7000 may have flexibility.

The display portion 7000 can be fabricated using the display device or the like of one embodiment of the present invention. One embodiment of the present invention makes it possible to provide a highly reliable electronic device having a curved display portion.

FIG. 11A illustrates an example of a mobile phone. A mobile phone 7110 illustrated in FIG. 11A includes a housing 7101, the display portion 7000, operation buttons 7103, an external connection port 7104, a speaker 7105, a microphone 7106, a camera 7107, and the like.

The mobile phone 7110 includes a touch sensor in the display portion 7000. Operations such as making a call and inputting text can be performed by touch on the display portion 7000 with a finger, a stylus, or the like.

With the operation buttons 7103, power can be on or off. In addition, types of images displayed on the display portion 7000 can be switched; for example, switching from a mail creation screen to a main menu screen can be performed.

When a detection device such as a gyroscope sensor or an acceleration sensor is provided inside the mobile phone, the direction of display on the screen of the display portion 7000 can be automatically changed by determining the orientation of the mobile phone (whether the mobile phone is placed horizontally or vertically). Furthermore, the direction of display on the screen can be changed by touch on the display portion 7000, operation with the operation button 7103, sound input using the microphone 7106, or the like.

FIG. 11B illustrates an example of a portable information terminal. A portable information terminal 7210 illustrated in FIG. 11B includes a housing 7201 and the display portion 7000. The portable information terminal 7210 may also include an operation button, an external connection port, a speaker, a microphone, an antenna, a camera, a battery, or the like. The display portion 7000 is provided with a touch sensor. The operation of the portable information terminal can be performed by touch on the display portion 7000 with a finger, a stylus, or the like.

The portable information terminal exemplified in this embodiment functions as, for example, one or more of a telephone set, a notebook, and an information browsing system. Specifically, the portable information terminal can be used as a smartphone. The portable information terminal exemplified in this embodiment is capable of executing, for example, a variety of applications such as mobile phone calls, e-mailing, reading and editing texts, music reproduction, Internet communication, and a computer game.

The portable information terminal 7210 can display characters, image information, and the like on its plurality of surfaces. For example, three operation buttons 7202 can be displayed on one surface, and information 7203 indicated by a rectangle can be displayed on another surface. FIG. 11B illustrates an example in which the operation buttons 7202 are displayed on the top surface of the portable information terminal 7210 and the information 7203 is displayed on the side surface of the portable information terminal 7210. Note that the operation buttons 7202 may be displayed on the side surface of the portable information terminal 7210 and the information 7203 may be displayed on the top surface of the portable information terminal 7210, for example. Information may be displayed on three or more surfaces of the portable information terminal 7210.

Examples of the information 7203 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information 7203.

FIG. 11C illustrates an example of a television set. In a television set 7300, the display portion 7000 is incorporated into a housing 7301. Here, the housing 7301 is supported by a stand 7303.

The television set 7300 illustrated in FIG. 11C can be operated with an operation switch of the housing 7301 or a separate remote controller 7311. The display portion 7000 may include a touch sensor, and can be operated by touch on the display portion 7000 with a finger or the like. The remote controller 7311 may be provided with a display portion for displaying data output from the remote controller 7311. With operation keys or a touch panel of the remote controller 7311, channels and volume can be controlled and images displayed on the display portion 7000 can be controlled.

Note that the television set 7300 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

Figure 11D:
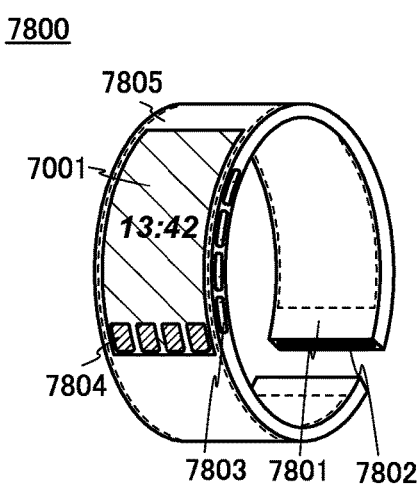
Figure 11E:
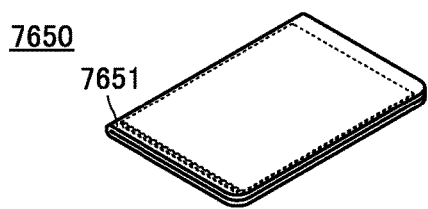
Figure 11F:
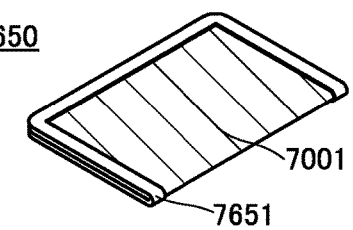

FIGS. 11D to 11F each illustrate an example of a portable information terminal including a flexible and foldable display portion 7001.

The display portion 7001 is fabricated using the display device or the like of one embodiment of the present invention. The display portion 7001 may include a touch sensor so that the portable information terminal can be operated by touch on the display portion 7001 with a finger or the like. One embodiment of the present invention makes it possible to provide a highly reliable electronic device including a flexible display portion.

FIG. 11D illustrates an example of a wrist-watch-type portable information terminal. A portable information terminal 7800 includes a band 7801, the display portion 7001, an input/output terminal 7802, operation buttons 7803, and the like. The band 7801 functions as a housing. A flexible battery 7805 can be included in the portable information terminal 7800. The battery 7805 may be provided to overlap with the display portion 7001 or the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, turning on or off of the power, turning on or off of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, an application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input/output terminal 7802. In the case where the input/output terminal 7802 is included in the portable information terminal 7800, data can be directly transmitted to and received from another information terminal via a connector. Charging through the input/output terminal 7802 is also possible. Note that charging of the portable information terminal exemplified in this embodiment can be performed by contactless power transmission without using the input/output terminal.

FIGS. 11E and 11F illustrate an example of a foldable portable information terminal. FIG. 11E illustrates a portable information terminal 7650 that is folded so that the display portion 7001 is on the inside. FIG. 11F illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged. Note that although FIGS. 11E and 11F illustrate the portable information terminal 7650 that is folded in two, the portable information terminal 7650 may be folded in three, four, or more. The portable information terminal 7650 may include an operation button, an external connection port, a speaker, a microphone, an antenna, a camera, a battery, or the like.

With the display device fabricated using one embodiment of the present invention, flexible electronic devices with high reliability can be manufactured. With the display device fabricated using one embodiment of the present invention, electronic devices can be manufactured at low cost.

This embodiment can be combined with the other embodiments as appropriate.

This application is based on Japanese Patent Application serial No. 2016-101134 filed with Japan Patent Office on May 20, 2016, the entire contents of which are hereby incorporated by reference.

What is claimed is:

1. A display device comprising:
a first substrate;
a first resin layer over the first substrate, the first resin layer comprising an opening;
a pixel portion over the first resin layer, the pixel portion comprising a transistor and a display element electrically connected to the transistor;
a terminal portion over the first resin layer, the terminal portion comprising a conductive layer;
a second resin layer over the terminal portion; and
a second substrate over the second resin layer,
wherein the conductive layer includes a first region that is exposed in the opening in the first resin layer,
wherein the second resin layer does not overlap with the pixel portion,
wherein the second resin layer includes a region overlapping with the first region, and
wherein the conductive layer is the same layer as at least one of a gate of the transistor and a source and a drain of the transistor.

2. The display device according to claim 1,
wherein the conductive layer has a stacked structure of a first conductive layer and a second conductive layer, and
wherein the first conductive layer includes an oxide conductive material and has a region in contact with the first resin layer.

3. The display device according to claim 1, further comprising an FPC electrically connected to the terminal portion,
wherein the FPC has a region overlapping with the pixel portion.

4. The display device according to claim 3,
wherein a third substrate including an IC chip is provided between the first substrate and the FPC, and
wherein the FPC is electrically connected to the terminal portion through the IC chip.

5. The display device according to claim 1,
wherein the second resin layer surrounds a periphery of the pixel portion, and
wherein the second resin layer functions as a sealant.

6. The display device according to claim 1,
wherein the second resin layer functions as a spacer.

7. A display device comprising:
a first substrate;
a first resin layer over the first substrate, the first resin layer comprising an opening;
a pixel portion over the first resin layer, the pixel portion comprising a transistor and a display element electrically connected to the transistor;
a terminal portion over the first resin layer, the terminal portion comprising a conductive layer;
a second resin layer over the terminal portion;
a third resin layer over the pixel portion and the terminal portion; and
a second substrate over the third resin layer,
wherein the conductive layer includes a first region that is exposed in the opening in the first resin layer,
wherein the second resin layer does not overlap with the pixel portion,
wherein the second resin layer includes a region overlapping with the first region, and
wherein the conductive layer is the same layer as at least one of a gate of the transistor and a source and a drain of the transistor.

8. The display device according to claim 7,
wherein the conductive layer has a stacked structure of a first conductive layer and a second conductive layer, and
wherein the first conductive layer includes an oxide conductive material and has a region in contact with the first resin layer.

9. The display device according to claim 7, further comprising an FPC electrically connected to the terminal portion,
wherein the FPC has a region overlapping with the pixel portion.

10. The display device according to claim 9,
wherein a third substrate including an IC chip is provided between the first substrate and the FPC, and
wherein the FPC is electrically connected to the terminal portion through the IC chip.

11. The display device according to claim 7,
wherein the second resin layer surrounds a periphery of the pixel portion, and
wherein the second resin layer functions as a sealant.

12. The display device according to claim 7,
wherein the second resin layer functions as a spacer.

13. A display device comprising:
a first substrate;
a pixel portion above the first substrate, the pixel portion comprising a transistor and a display element electrically connected to the transistor;
a terminal portion above the first substrate, the terminal portion comprising a conductive layer that is the same layer as at least one of a gate of the transistor and a source and a drain of the transistor;
a resin layer above the terminal portion;
a second substrate above the terminal portion and the pixel portion; and
an FPC,
wherein the resin layer does not overlap with the pixel portion,
wherein the FPC is electrically connected to the conductive layer, and
wherein the FPC includes a region overlapping with the pixel portion, and a region overlapping with the resin layer with the conductive layer therebetween.

\* \* \* \* \*